(12) United States Patent
Champoux et al.

(10) Patent No.: US 10,288,681 B2
(45) Date of Patent: *May 14, 2019

(54) TEST ARCHITECTURE WITH A SMALL FORM FACTOR TEST BOARD FOR RAPID PROTOTYPING

(71) Applicant: Advantest Corporation, Tokyo (JP)

(72) Inventors: Duane Champoux, San Jose, CA (US); Mei-Mei Su, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/982,910

(22) Filed: May 17, 2018

(65) Prior Publication Data

US 2018/0267101 A1 Sep. 20, 2018

Related U.S. Application Data

(63) Continuation of application No. 15/914,553, filed on Mar. 7, 2018, which is a continuation-in-part of (Continued)

(51) Int. Cl.
*G01R 31/26* (2014.01)
*G01R 35/00* (2006.01)
(Continued)

(52) U.S. Cl.
CPC ....... *G01R 31/31724* (2013.01); *G01R 35/00* (2013.01); *G01R 31/2601* (2013.01); (Continued)

(58) Field of Classification Search
CPC ........ G01R 31/21903; G01R 31/31907; G01R 31/31919; G01R 31/31724
See application file for complete search history.

(56) References Cited

U.S. PATENT DOCUMENTS 5,497,378 A 3/1996 Amini et al.
5,805,571 A 9/1998 Zwan et al.
(Continued)

FOREIGN PATENT DOCUMENTS

KR 100778459 B1 11/2007
KR 20090015895 A 2/2009
(Continued)

OTHER PUBLICATIONS

FPGA Wikipedia Entry (http://en.wikipedia.org/wiki/Field-programmable_gate_array), Retrieved Apr. 1, 2016, 13 pages.
(Continued)

*Primary Examiner* — Michael J Dalbo

(57) ABSTRACT

An automated test equipment (ATE) apparatus is presented. The apparatus comprises a computer system comprising a system controller, wherein the system controller is communicatively coupled to a site module board comprising a tester processor and an FPGA wherein the system controller is operable to transmit instructions to the tester processor, and wherein the tester processor is operable to generate commands and data from the instructions for coordinating testing of a device under test (DUT) wherein the site module board comprises a compact form factor suitable for use during prototyping, and wherein the site module board is operable to be coupled with a DUT. Further, the FPGA is communicatively coupled to the tester processor, wherein the FPGA comprises at least one hardware accelerator circuit operable to internally generate commands and data transparently from the tester processor for testing the DUT.

27 Claims, 14 Drawing Sheets

Related U.S. Application Data application No. 13/773,569, filed on Feb. 21, 2013, now Pat. No. 10,162,007.

(51) Int. Cl.
  *G01R 31/317* (2006.01)
  *G01R 31/319* (2006.01)
  *G06F 11/263* (2006.01)

(52) U.S. Cl.
  CPC .. *G01R 31/31723* (2013.01); *G01R 31/31903* (2013.01); *G01R 31/31919* (2013.01); *G06F 11/263* (2013.01)

(56) References Cited

U.S. PATENT DOCUMENTS

| | | |
|---|---|---|
| 6,026,230 A | 2/2000 | Lin et al. |
| 6,069,873 A | 5/2000 | Pugaczewski et al. |
| 6,357,023 B1 | 3/2002 | Co et al. |
| 6,681,351 B1 | 1/2004 | Kittross et al. |
| 6,904,375 B1 | 6/2005 | Sabih et al. |
| 7,181,360 B1 | 2/2007 | Nikolac et al. |
| 7,269,805 B1 | 9/2007 | Ansari et al. |
| 7,343,558 B2 | 3/2008 | Kadota |
| 7,363,188 B1 | 4/2008 | Olgaard et al. |
| 7,555,589 B2 | 6/2009 | Kang |
| 7,590,903 B2 | 9/2009 | Volkerink et al. |
| 7,707,468 B2 | 4/2010 | Volkerink et al. |
| 7,772,828 B2 | 8/2010 | Jang et al. |
| 8,127,187 B2 | 2/2012 | Xia et al. |
| 8,161,402 B1 | 4/2012 | Edson et al. |
| 8,545,248 B2 | 10/2013 | Davey et al. |
| 8,564,297 B2 | 10/2013 | Burns et al. |
| 8,581,614 B2 | 11/2013 | Co et al. |
| 8,660,424 B2 | 2/2014 | Achkir et al. |
| 8,718,967 B2 | 5/2014 | Filler et al. |
| 8,842,480 B2 | 9/2014 | Ellis et al. |
| 8,850,267 B2 | 9/2014 | Aggarwal et al. |
| 9,230,046 B2 | 1/2016 | Asaad et al. |
| 9,952,276 B2 | 4/2018 | Frediani |
| 2002/0007025 A1 | 1/2002 | Crowther et al. |
| 2002/0055834 A1 | 5/2002 | Andrad et al. |
| 2002/0163351 A1 | 11/2002 | Koh et al. |
| 2002/0184326 A1 | 12/2002 | Thomson |
| 2003/0191590 A1 | 10/2003 | Narayan |
| 2003/0231741 A1 | 12/2003 | Rancu et al. |
| 2004/0000922 A1 | 1/2004 | Witte |
| 2004/0015739 A1 | 1/2004 | Heinkel et al. |
| 2004/0059536 A1 | 3/2004 | Chang et al. |
| 2004/0168111 A1 | 8/2004 | Arnold et al. |
| 2004/0225465 A1 | 11/2004 | Pramanick et al. |
| 2005/0022088 A1 | 1/2005 | Nakayama |
| 2005/0154550 A1 | 7/2005 | Singh et al. |
| 2005/0159050 A1 | 7/2005 | Hama et al. |
| 2005/0256969 A1 | 11/2005 | Yancey et al. |
| 2005/0262414 A1 | 11/2005 | Elston et al. |
| 2005/0273685 A1 | 12/2005 | Sachdev et al. |
| 2005/0278682 A1 | 12/2005 | Dowling |
| 2006/0170435 A1 | 8/2006 | Granicher et al. |
| 2006/0195744 A1 | 8/2006 | Petersen |
| 2007/0168808 A1 | 7/2007 | Ong |
| 2007/0220380 A1 | 9/2007 | Ohanyan |
| 2007/0266288 A1 | 11/2007 | Volkerink et al. |
| 2007/0271059 A1 | 11/2007 | Vonstaudt |
| 2007/0282556 A1 | 12/2007 | Achkar et al. |
| 2008/0015798 A1 | 1/2008 | Bullock et al. |
| 2008/0126899 A1 | 5/2008 | Brennan et al. |
| 2008/0189060 A1 | 8/2008 | Zellner et al. |
| 2008/0204066 A1 | 8/2008 | Jang et al. |
| 2008/0285571 A1 | 11/2008 | Arulambalam et al. |
| 2009/0100304 A1 | 4/2009 | Li et al. |
| 2009/0112548 A1 | 4/2009 | Conner |
| 2009/0113245 A1 | 4/2009 | Conner |
| 2009/0172480 A1 | 7/2009 | Jeddeloh |
| 2009/0212799 A1 | 8/2009 | de la Puente et al. |
| 2010/0097071 A1 | 4/2010 | Lee et al. |
| 2010/0157854 A1 | 6/2010 | Anderson et al. |
| 2010/0190451 A1 | 7/2010 | Huber et al. |
| 2010/0312517 A1 | 12/2010 | McNamara et al. |
| 2010/0313071 A1 | 12/2010 | Conner |
| 2011/0050268 A1 | 3/2011 | Co et al. |
| 2011/0072307 A1 | 3/2011 | Hatley et al. |
| 2011/0078525 A1 | 3/2011 | Xia et al. |
| 2011/0099424 A1 | 4/2011 | Rivera Trevino et al. |
| 2011/0103235 A1 | 5/2011 | Luong et al. |
| 2011/0112790 A1 | 5/2011 | Lavie et al. |
| 2011/0248737 A1 | 10/2011 | Takeshita et al. |
| 2011/0276302 A1 | 11/2011 | Rivoir |
| 2011/0298486 A1 | 12/2011 | Co et al. |
| 2012/0019402 A1 | 1/2012 | Oga |
| 2012/0191402 A1 | 7/2012 | Filler et al. |
| 2013/0013969 A1 | 1/2013 | Rajarao et al. |
| 2013/0015873 A1 | 1/2013 | Suzuki et al. |
| 2013/0080503 A1 | 3/2013 | Dean et al. |
| 2014/0207402 A1 | 7/2014 | Ferry |
| 2014/0236524 A1 | 8/2014 | Frediani et al. |
| 2014/0236525 A1* | 8/2014 | Chan ............... G01R 31/31907 702/119 |
| 2014/0236526 A1 | 8/2014 | Frediani et al. |
| 2014/0236527 A1 | 8/2014 | Chan et al. |
| 2014/0237292 A1 | 8/2014 | Chan |
| 2014/0244204 A1 | 8/2014 | Frediani |
| 2015/0028908 A1 | 1/2015 | Kushnick et al. |

FOREIGN PATENT DOCUMENTS

| | | |
|---|---|---|
| KR | 20090041528 A | 4/2009 |
| KR | 20100073662 A | 7/2010 |
| KR | 1020100120692 | 11/2010 |
| KR | 101111482 B1 | 2/2012 |
| KR | 20120026387 A | 3/2012 |
| TW | 583534 B | 4/2004 |
| TW | I363879 B | 5/2012 |
| WO | 2009105762 | 8/2009 |
| WO | 2011149725 A | 12/2011 |
| WO | 2011149725 A2 | 12/2011 |
| WO | 2011150409 A | 12/2011 |
| WO | 2012070076 A | 5/2012 |
| WO | 2012126087 A | 9/2012 |

OTHER PUBLICATIONS

International Serach Report, International Application No. PCT/US2013/049118, dated Jan. 22, 2014, 5 pages.

Merrian Webster Online Dictionary Definition of "Protocol," Retrieved Jan. 6, 2017, 2 pages.

\* cited by examiner

1400

Communicatively Couple a Tester Board comprising a FPGA to an Interface Board Connected to a System Controller
1410

Communicatively Couple a DUT emulator to the Tester Board, wherein the DUT emulator also comprises an FPGA programmed to emulate a DUT, and wherein the DUT emulator is operable to communicate with the tester board to test the communication channel between the tester board and the DUT emulator
1412

FIG. 14

TEST ARCHITECTURE WITH A SMALL FORM FACTOR TEST BOARD FOR RAPID PROTOTYPING

CROSS-REFERENCE TO RELATED APPLICATIONS

Related Applications

The present application is a continuation of U.S. patent application Ser. No. 15/914,553, filed Mar. 7, 2018, entitled "A TEST ARCHITECTURE WITH A FPGA BASED TEST BOARD TO SIMULATE A DUT OR END-POINT," naming Duane Champoux and Mei-Mei Su as inventors, which is a continuation-in-part of U.S. patent application Ser. No. 13/773,569, filed Feb. 21, 2013, entitled "A TEST ARCHITECTURE HAVING MULTIPLE FPGA BASED HARDWARE ACCELERATOR BLOCKS FOR TESTING MULTIPLE DUTS INDEPENDENTLY," naming Gerald Chan, Eric Kushnick, Mei-Mei Su and Andrew Niemic as inventors. Both applications are incorporated herein by reference in their entirety and for all purposes.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc. connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs needed to be run to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., SATA the user would ordinarily need to replace the PCIe hardware bus adapter cards with bus adapter cards supporting the SATA protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

Another drawback of current tester systems is that the test systems tend to be large, cumbersome and cost-prohibitive. For example, the ATE body 100 in FIG. 1 may be a tester system configured to connect to and test tens or hundreds of DUTs simultaneously. While larger test systems may be ideal for testing in a production environment where a high volume of devices needs to be tested post-production, they are not ideal for development environments. In development environments, a development engineer may need to connect at most one or two DUTs to a tester system in order to perform debugging or other types of diagnostic testing.

A further challenge associated with traditional tester systems is that they do not provide adequate functionality to enable a development engineer to test next generation devices that are not commercially available. For example, if a next generation PCIe device or DUT is not yet commercially available, a development engineer would have no way of testing firmware or software being developed for the next generation device. In other words, traditional tester systems do not provide functionality that allows a development engineer to readily develop and test firmware or software targeted towards yet to be produced next generation devices.

BRIEF SUMMARY OF THE INVENTION

Accordingly, a need exists for a tester architecture that can address the problems with the systems described above. What is needed is a test architecture whereby the command and test pattern generation functionality can be transferred onto the FPGA, so that the processing load on the tester processor and the bandwidth requirements on the system bus can be kept at a minimum. This would be more efficient than prior configurations where the tester processor bore the entire processing load and the system bus conveyed test data and commands for all the DUTs connected to the ATE body. Further, what is needed is a test architecture whereby the communicative protocol engine can be programmed on FPGA devices so that the protocol used to communicate with the DUTs is reconfigurable.

In addition, what is needed is a tester system whereby the testing functionalities of the tester are reduced onto a small scale, small form factor, inexpensive test card or test board. This allows testing functionality and test development, e.g., test prototyping, to be performed easily on an engineer's bench top or lent or sold to a customer for test development. The small-scale test board or test card can also be fully software and hardware compatible with the larger tester systems. Accordingly, test development on the test card is readily portable to the larger systems.

Further, what is needed is a small scale test board that is also fully programmable and can be re-programmed to be an end-point to simulate a next generation device (or DUT), for instance. This provides an inexpensive way to re-purpose a miniature test card or board as a next generation device. With this small scale DUT emulator, the development of the tester for next generation devices can be readily completed.

Using the beneficial aspects of the systems described, without their respective limitations, embodiments of the present invention provide a novel solution to address these problems.

In one embodiment, an automated test equipment (ATE) system is disclosed. The system comprises a first test board including a first FPGA communicatively coupled to a controller via an interface board, wherein the first FPGA comprises a first core programmed to implement a communication protocol, and further wherein the FPGA is programmed with at least one hardware accelerator circuit operable to internally generate commands and data for testing a DUT. The system also includes a second test board comprising a second FPGA communicatively coupled to the first test board, wherein the second FPGA comprises a second core programmed to implement a communication protocol for a device under test, wherein the second FPGA is further programmed to simulate a DUT, and wherein the first FPGA is operable to communicate with the second FPGA in order to test a communication link between the first test board and the second test board.

In another embodiment, an automated test equipment (ATE) system is disclosed. The system comprises a first test board comprising a first FPGA communicatively coupled to a controller via an interface board, wherein the first FPGA comprises two cores, wherein each core is programmed to implement a communication protocol, and further wherein the FPGA is programmed with at least one hardware accelerator circuit operable to internally generate commands and data for testing a device under test (DUT) of a prescribed type. The system also comprises a second test board comprising a second FPGA communicatively coupled to the first test board, wherein the second FPGA comprises a second core programmed to implement a communication protocol for a DUT of the prescribed type, wherein the second FPGA is further programmed to simulate a DUT of the prescribed type. Additionally, the system comprises a third test board comprising a third FPGA communicatively coupled to the first test board, wherein the third FPGA comprises a third core programmed to implement a communication protocol for a device under test of the prescribed type, and wherein the third FPGA is further programmed to simulate a DUT of the prescribed type.

In a different embodiment, a method for testing using an automated test equipment (ATE) is disclosed. The method comprises communicatively coupling a first test board comprising a first FPGA to a controller via an interface board, wherein the first FPGA comprises a first core programmed to implement a communication protocol, and further wherein the FPGA is programmed with at least one hardware accelerator circuit operable to internally generate commands and data for testing a device under test (DUT) of a prescribed type. Further, the method comprises communicatively coupling a second test board comprising a second FPGA to the first test board, wherein the second FPGA comprises a second core programmed to implement a communication protocol for a DUT of the prescribed type, wherein the second FPGA is further programmed to simulate a DUT of the prescribed type, and wherein the first FPGA is operable to communicate with the second FPGA in order to test a communication link between the first test board and the second test board.

In one embodiment, an automated test equipment (ATE) apparatus is presented. The apparatus comprises a computer system comprising a system controller, wherein the system controller is communicatively coupled to a site module board comprising a tester processor and an FPGA wherein the system controller is operable to transmit instructions to the tester processor, and wherein the tester processor is operable to generate commands and data from the instructions for coordinating testing of a device under test (DUT) wherein the site module board comprises a compact form factor suitable for use during prototyping, and wherein the site module board is operable to be coupled with a DUT. Further, the FPGA is communicatively coupled to the tester processor, wherein the FPGA comprises at least one hardware accelerator circuit operable to internally generate commands and data transparently from the tester processor for testing the DUT. Further, the tester processor is configured to operate in one of a plurality of functional modes, wherein each functional mode is configured to allocate functionality for generating commands and for generating data between said tester processor and said FPGA in a different manner.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 14 depicts a flowchart 1400 of an exemplary process of performing a test using a DUT emulator in accordance with an embodiment of the present invention.

Figure 1:
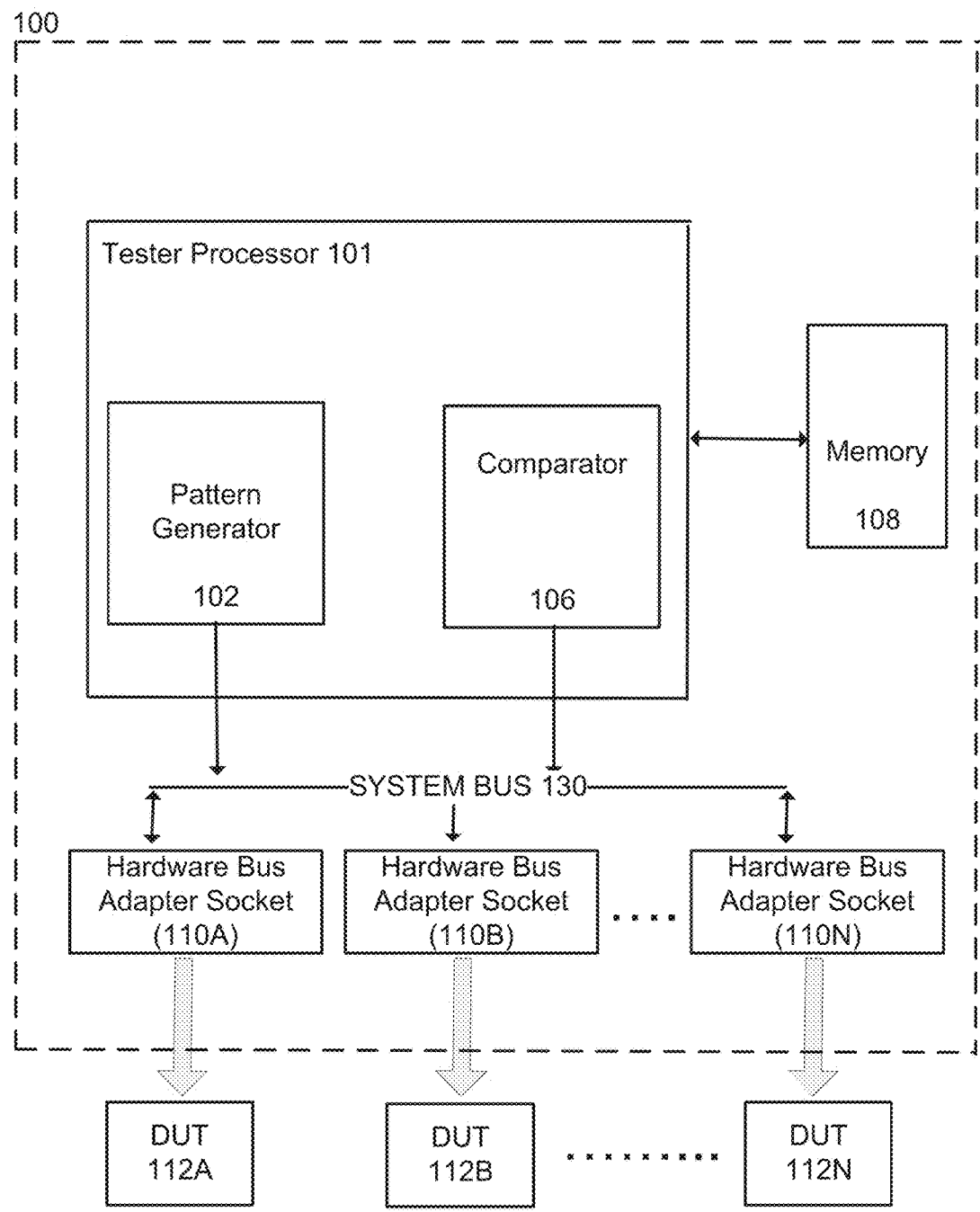
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accessing," "adding," "adjusting," "analyzing," "applying," "assembling," "assigning," "calculating," "capturing," "combining," "comparing," "collecting," "creating," "debugging," "defining," "depicting," "detecting," "determining," "displaying," "establishing," "executing," "generating," "grouping," "identifying," "initiating," "modifying," "monitoring," "moving," "outputting," "performing," "placing," "presenting," "processing," "programming," "querying," "removing," "repeating," "resuming," "sampling," "simulating," "sorting," "storing," "subtracting," "suspending," "tracking," "transforming," "unblocking," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

A Test Architecture with a Small Form Factor Test Board for Rapid Prototyping

Test throughput can be usually be improved in a number of ways. One way to decrease the testing time of DUTs is by transferring functionality formerly performed in software on a general-purpose tester processor to hardware accelerators implemented on FPGA devices. Another way is by increasing the number and types of devices under test (DUTs) that can be tested under prevailing hardware and time constraints, for example, by configuring the hardware so that DUTs supporting many different types of protocols, e.g., PCIe, SATA, etc. can be tested with the same hardware without needing to replace or substitute any hardware components. Embodiments of the present invention are directed to so improving test efficiency in the hardware of the automatic test equipment.

Figure 2:
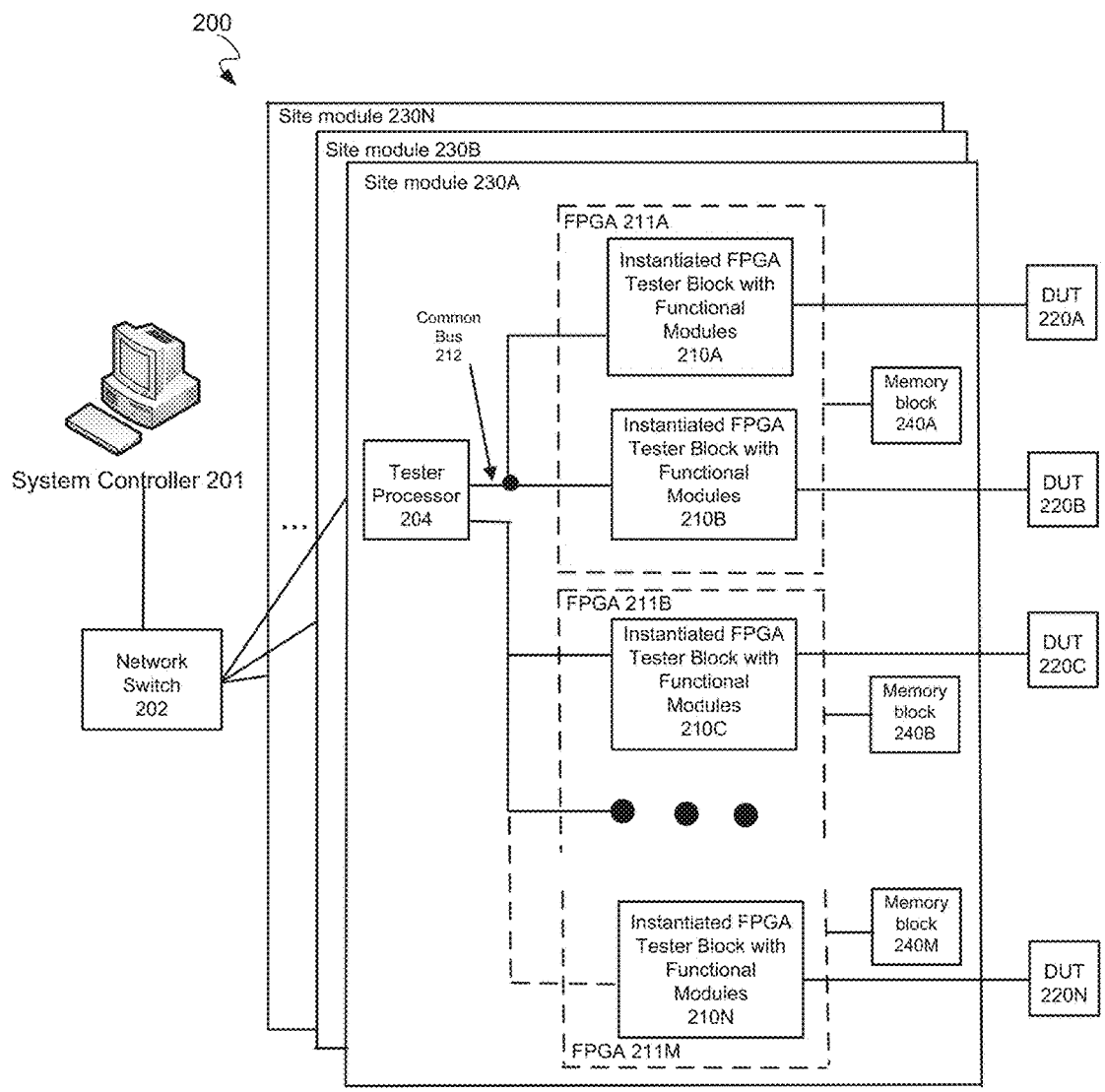
FIG. 2 is a high level schematic block diagram of the interconnections between the system controller, the site modules and the DUTs according to one embodiment of the present invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N.

In one embodiment, the system controller 201 may be a computer system, e.g., a personal computer (PC) that provides a user interface for the user of the ATE to load the test programs and run tests for the DUTs connected to the ATE 200. The Verigy Stylus Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly.

The site module boards 230A-230N can each comprise at least one tester processor 204 and at least one FPGA device. The tester processor 204 and the FPGA devices 211A-211M on the site module board run the test methods for each test case in accordance with the test program instructions received from the system controller 201. In one embodiment the tester processor can be a commercially available Intel 8086 CPU or any other well-known processor. Further, the tester processor may be operating on the Ubuntu OS x64 operating system and running the Core Software, which allows it to communicate with the Stylus software running on the system controller, to run the test methods. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240 M can each contain one or more memory modules, wherein each memory module within the memory block can be dedicated to one or more of the instantiated FPGA tester blocks 210A-210B. Accordingly, each of the instantiated FPGA tester blocks 210A-

210B can be connected to its own dedicated memory module within memory block 240A. In another embodiment, instantiated FPGA tester blocks 210A and 210B can share one of the memory modules within memory block 240A.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, instantiated FPGA tester block 210A can be configured to run the PCIe protocol while instantiated FPGA tester block 210B can be configured to run the SATA protocol. This allows the tester hardware to test DUTs supporting different protocols simultaneously. FPGA 211A can now be connected to test a DUT that supports both PCIe and SATA protocols. Alternatively, it can be connected to test two different DUTs, one DUT supporting the PCIe protocol and the other DUT supporting the SATA protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

Figure 3:
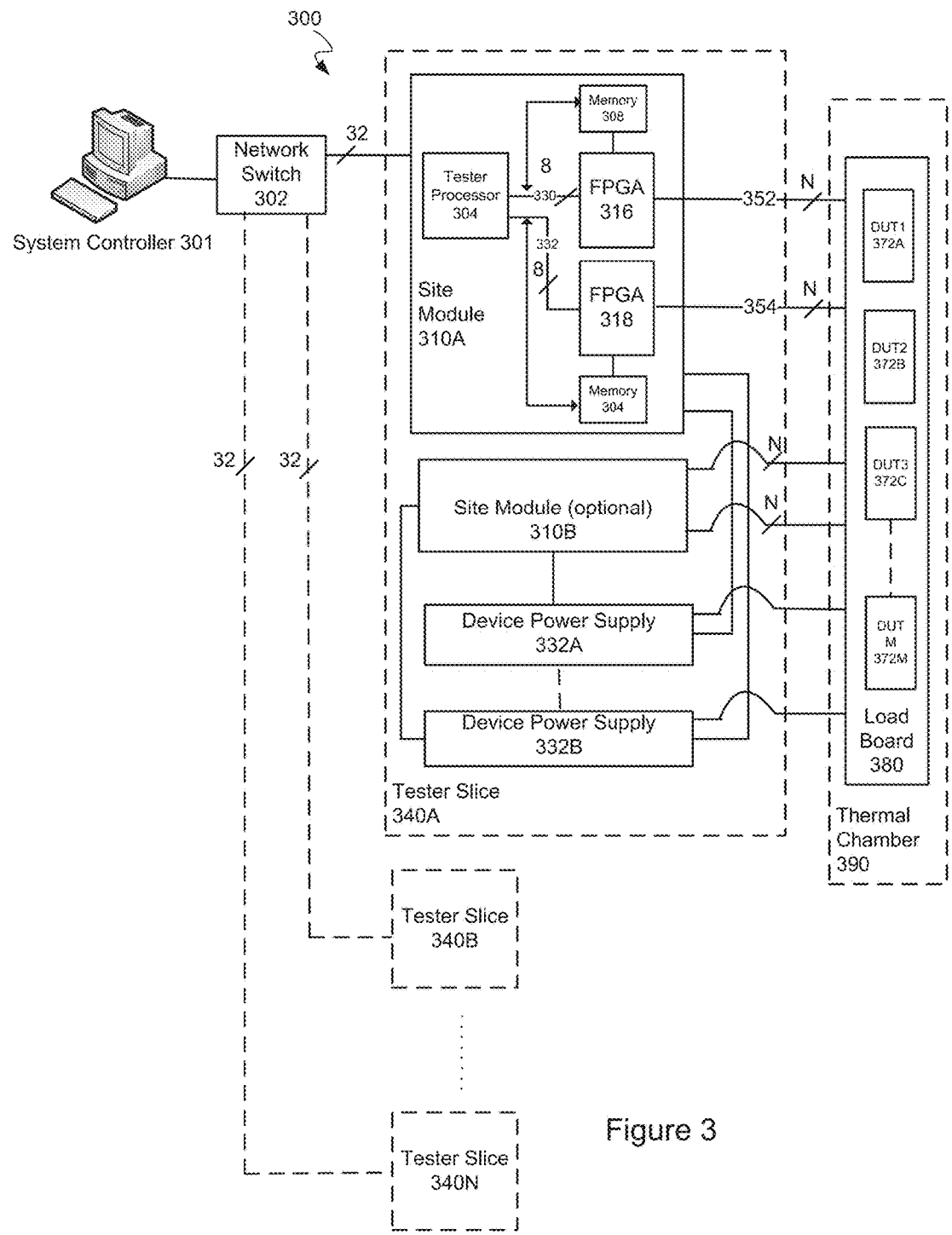
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention. Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

Figure 4:
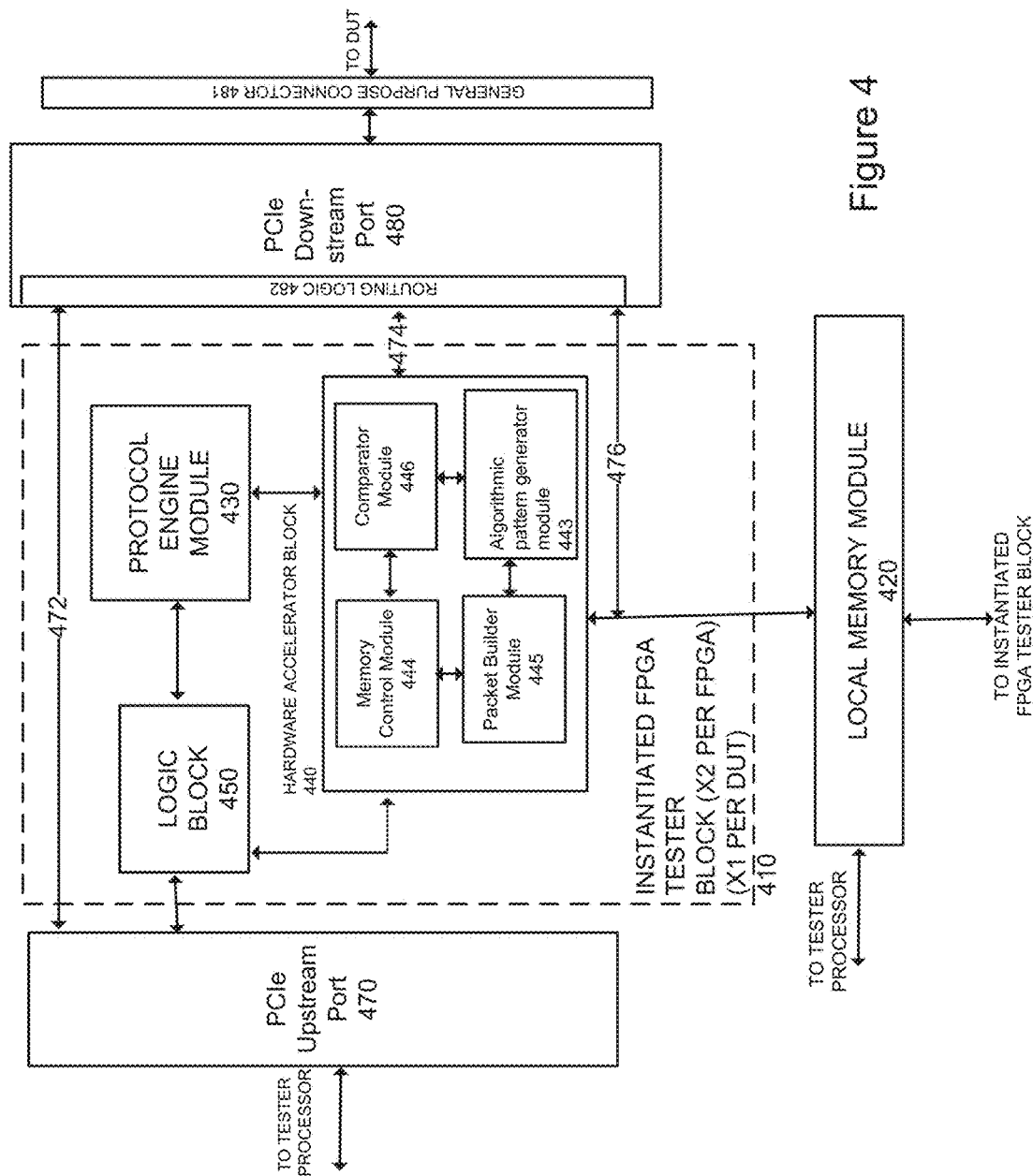
FIG. 4 is a detailed schematic block diagram of the instantiated FPGA tester block of FIG. 2 according to an embodiment of the present invention.

FIG. 4 is a detailed schematic block diagram of an instantiated FPGA tester block of FIG. 2 according to an embodiment of the present invention.

Referring to FIG. 4, the instantiated FPGA tester block 410 is connected to the tester processor through PCIe upstream port 270 and to the DUT through PCIe downstream port 480.

Instantiated FPGA block 410 can comprise a protocol engine module 430, a logic block module 450, and a hardware accelerator block 440. The hardware accelerator block 440 can further comprise a memory control module 444, comparator module 446, a packet builder module 445, and an algorithmic pattern generator (APG) module 443.

In one embodiment, logic block module 450 comprises decode logic to decode the commands from the tester processor, routing logic to route all the incoming commands and data from the tester processor 304 and the data generated by the FPGA devices to the appropriate modules, and arbitration logic to arbitrate between the various communication paths within instantiated FPGA tester block 410.

In one implementation, the communication protocol used to communicate between the tester processor and the DUTs can advantageously be reconfigurable. The communicative protocol engine in such an implementation is programmed directly into the protocol engine module 430 of instantiated FPGA tester block 410. The instantiated FPGA tester block 410 can therefore be configured to communicate with the DUTs in any protocol that the DUTs support. The pre-verified interface or IP cores mentioned above, for example, can be programmed into the protocol engine module 430. This ensures compliance and compatibility according to a given interface standard. Further, the IP core allows the tester to achieve flexibility in that the IP core enables software-based changing of interfaces. Embodiments provide an ability to test multiple types of DUTs independent of the hardware bus adapter sockets. With such interface flexibility, new interfaces may be loaded into the IP core of a programmable chip thereby eliminating the need for the hardware bus adapter sockets (discussed in connection with FIG. 1).

In one embodiment, for example, for storage/SSDs/HDDs, each FPGA comprises a configurable IC that connects to a SSD and that is programmable to provide storage based patterns through a storage specific interface such as SATA or SAS.

In one embodiment, for RF modules, an FPGA comprises a configurable IC where the configurable interface core is programmed to provide USB or PCIe interface connection, which use current RF modules.

In one embodiment, an FPGA may be an SSD or RF module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc. In one embodiment, in the case of an RF module-based tester, the interface core may be programmed to provide standardized protocol-based communications interfaces such as provide USB, PCIe, etc. In one embodiment, in a case of modules with optical interconnects, the interface core may be programmed to provide standardized protocol-based communication that is used to communicate with the module over an optical interconnect.

Accordingly, from an electrical perspective, the FPGAs utilize an IP core instead of a hardware bus adapter socket. Enabled by software programming of the programmable chip resources of an FPGA, a given IP core may be easily reprogrammed and replaced with another IP core without changing the physical FPGA chip or other hardware components. For example, if a given FPGA-based tester currently supports SATA, all that would be required to be able to connect to a fibre channel DUT is for the FPGA to be reprogrammed to use a fibre channel IP core instead of the existing IP core configured for SATA.

This advantageously eliminates the need for hardware bus adapter cards and no protocol-specific hardware need be replaced to test DUTs with different protocol support. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 4, if the DUT coupled to the PCIe downstream port 480 is a PCIe device, a bit-file containing the instantiation of the PCIe protocol can be downloaded through the PCIe upstream port 470 and installed in the IP core on the protocol engine module 430. Each FPGA device 316 or 318 can comprise one or more instantiated FPGA tester block and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

The hardware accelerator block 440 of FIG. 4 can be used to expedite certain functions on FPGA hardware than would be possible to do in software on the tester processor. The hardware accelerator block 440 can supply the initial test pattern data used in testing the DUTs. It can also contain functionality to generate certain commands used to control the testing of the DUTs. To generate test pattern data, accelerator block 440 uses the algorithmic pattern generator module 443.

The hardware accelerator block 440 can use comparator module 446 to compare the data being read from the DUTs to the data that was written to the DUTs in a prior cycle. The comparator module 446 comprises functionality to flag a mismatch to the tester processor 304 to identify devices that are not in compliance. More specifically, the comparator module 446 can comprise an error counter that keeps track of the mismatches and communicates them to the tester processor 304.

Hardware accelerator block 440 can connect to a local memory module 420. Memory module 420 performs a similar function to a memory module within any of the memory blocks 240A-240M. Memory module 420 can be controlled by both the hardware accelerator block 440 and the tester processor 304. The tester processor 304 can control the local memory module 420 and write the initial test pattern data to it.

The memory module 420 stores the test pattern data to be written to the DUTs and the hardware accelerator block 440 accesses it to compare the data stored to the data read from the DUTs after the write cycle. The local memory module 420 can also be used to log failures. The memory module would store a log file with a record of all the failures the DUTs experienced during testing. In one embodiment, the accelerator block 440 has a dedicated local memory module block 420 that is not accessible by any other instantiated FPGA tester blocks. In another embodiment, the local memory module block 420 is shared with a hardware accelerator block in another instantiated FPGA tester block.

Hardware accelerator block 440 can also comprise a memory control module 444. The memory control module 444 interacts with and controls read and write access to the memory module 420.

Finally, hardware accelerator block 440 comprises a packet builder module 445. The packet builder module is used by the hardware accelerator block in certain modes to construct packets to be written out to the DUTs comprising header/command data and test pattern data.

In certain embodiments, hardware accelerator block 440 can be programmed by the tester processor 304 to operate in one of several modes of hardware acceleration. In bypass mode, the hardware accelerator is bypassed and commands and test data are sent by the tester processor 304 directly to the DUT through path 472. In hardware accelerator pattern generator mode, test pattern data is generated by the APG module 443 while the commands are generated by the tester processor 304. The test packets are transmitted to the DUT through path 474. In hardware accelerator memory mode, the test pattern data is accessed from local memory module 420 while the commands are generated by the tester processor 304. The test pattern data is transmitted to the DUT through path 476. Routing logic 482 is needed to arbitrate between paths 472, 474 and 476 to control the flow of data to the DUT.

The site module can comprise a general purpose connector 481. Because the protocol engine module 430 can be configured to run any number of various communicative protocols, a general purpose high speed connector 481 is required on the site module. Accordingly, if the protocol implemented on the protocol engine module 430 needs to be changed, no accompanying physical modification needs to be made on the site module. The site module connects to the DUT using load board 380 that can connect to the general purpose connector on the site module end, but is specific to the protocol being implemented on the DUT end. DUTs supporting different communicative protocols will require different configurations. Accordingly, the load board needs to be switched out and replaced if the protocol is reprogrammed to accommodate DUTs requiring a different configuration.

As mentioned previously, one of the drawbacks of a larger scale tester system is that the tester systems tend to be large, cumbersome and cost-prohibitive. For example, the ATE body 100 in FIG. 1 may be a tester system configured to connect to and test tens or hundreds of DUTs simultaneously. Further, traditionally, testers are complex, large and housed in large test systems. These testers are rather expensive ($200 k+) and do not lend themselves to easy portability nor do they easily lend themselves for applications that could be performed on an engineer's bench top nor available to lend to customers in any volume for customer development purposes. Namely, these large scale testers provide FPGA support for accelerating tester functionalities such as data production (algorithmic pattern generation), traffic generation and comparison of test results, etc. similar to the systems illustrated in FIGS. 2 and 3.

While larger test systems similar to the systems shown in FIGS. 2 and 3 may be ideal for testing in a production environment where a high volume of devices needs to be tested post-production, they are not ideal for development environments. In development environments, a development engineer may need to connect at most one or two DUTs to a tester system in order to perform debugging or other types of diagnostic testing.

Embodiments of the present invention address this issue by reducing the hardware acceleration functionalities onto a small scale, small form factor, inexpensive test card or test board ($4-10 k). This allows testing functionality and test development to be performed easily on an engineer's bench top or lent or sold to a customer for test development. The small scale test board or test card is also fully software and hardware compatible with the larger testers similar to the ones shown in FIGS. 2 and 3. So test development on the test card is readily portable to the larger systems.

As mentioned above, in one embodiment, each of the site module boards 230A-230N shown in FIG. 2 may be a separate standalone board used for purposes of evaluation and development that attaches to custom-built load board fixtures, on which one or more DUTs are loaded, and also to the system controller 201 from where the test programs are received. In other embodiments, the site module boards may be implemented as plug-in expansion cards or as daughter boards that plug into the chassis of the system controller 201 directly.

Figure 10:
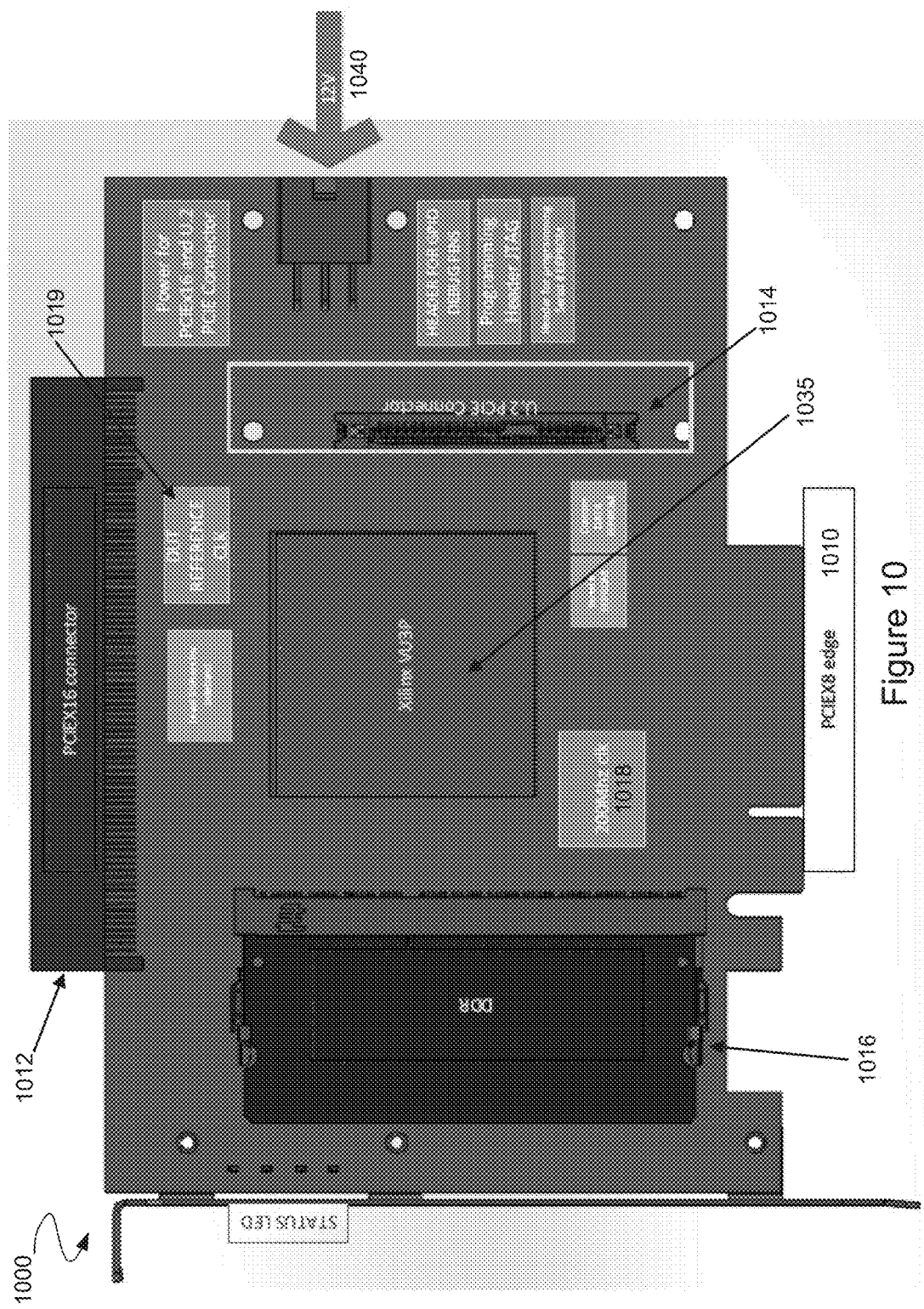
FIG. 10 illustrates the small scale test board or test card 1000 that can be programmed as a switch/tester or a DUT emulator in accordance with an embodiment of the present invention.

FIG. 10 illustrates the small scale test board or test card 1000 that can be programmed as a "switch"/tester or a DUT emulator in accordance with an embodiment of the present invention. The test board or test card contains two connectors, a PCIE connector 1012 on the top and a PCIE edge connector 1010 on the bottom (for mating with a edge connector of a motherboard). The bottom connector is for interfacing with a computer (or to an interface board connected to a computer or tester). For example the bottom connector 1010 can plug into the chassis of system controller 201 as discussed above.

The top connector 1012 can be used for interfacing with a DUT or a DUT emulator. There is also a U.2 PCIE connector 1014 on the board which can interface with another DUT, for instance. The board contains DDR memory 1016, clocks 1018 and 1019, and other support circuits.

Importantly, the test board or test card of the present invention contains an FPGA 1035 that is programmed to function as an accelerator to perform all the required test functionality to test a DUT, namely, to perform algorithmic pattern generation, packet building, memory interfacing, test data comparison, etc., similar to the FPGA discussed in connection with FIG. 2 to FIG. 4. In this fashion, the DUT is connected to the top connector 1012 (or to the U.2 connector 1014) and the bottom connector 1010 of the card is connected to a computer (or system controller).

The test board or test card could be used as a miniature test development platform for in-house test development and testing as well as given or sold to the customer so that they can do product development and test development. With respect to the miniature size and reduced expense, the test boards could be given or sold in volume to the customer. With respect to either in-house or customer development, since the tester-card is small and easily portable and fairly inexpensive, they can be given in volume to engineers so that individual test development can be performed on the bench top. Once the individual test development is performed in this fashion to say 90+% completion, the remainder of the development can be done on the larger system.

It should be noted that the test board 1000 is not limited to connecting with PCIe devices only, but could also be re-programmed to do SAS or SATA, etc., for instance. As discussed previously, each FPGA will comprise an IP core that can easily be reprogrammed and replaced with another IP core without changing the physical FPGA chip or other hardware components. Note, however, that in order to connect to DUTs besides PCIe, the board 1000 may need to use DUT specific adapters (instead of the PCIe connectors 1012 and 1014) or general purpose connectors similar to connector 481 discussed in connection with FIG. 4.

Another benefit of the interface flexibility of the FPGA-based tester embodiments discussed herein is that when a new interface standard may be quickly implemented after being released by a standardization body. Such a new interface standard may then be implemented on the programmable chip of an FPGA-based tester long before a physical hardware bus adapter board can be manufactured and sold as a solution in the PC market.

Embodiments described herein also provide the ability to generate early versions of an interface before bus adapter sockets are widely available and the ability to upgrade it when the standard finalizes. For example, in one embodiment, it is possible to implement early versions of a new standard and upgrade them as the standard is finalized. For example, in one embodiment, when a first cut of a standard (e.g., PCI Express 4.0) is released, it is possible to generate an IP core version that either implements the protocol at a slower speed, or implements a trimmed-down version of the protocol. Then, as the standard is finalized, software upgrades (e.g., that enable the full capabilities of the new protocol, etc.) would be possible without changing the tester hardware.

One challenge associated with the ability to develop testers for early versions of a new standard is that the DUTs to be tested are not yet commercially available for development or testing. In other words, one of the challenges associated with traditional tester systems is that they do not provide adequate functionality to enable a development engineer to test next generation devices that are not commercially available. For example, if a next generation PCIe or SATA device is not yet commercially available, a development engineer would have no way of testing firmware or software being developed for the next generation device. In other words, traditional tester systems do not provide functionality that allows a development engineer to develop and test firmware or software targeted towards next generation devices.

For example, currently, the tester illustrated in FIGS. 2 to 4 and the test board illustrated in FIG. 10 could be programmed with the PCI Express Generation 4 (PCIe 4.0) protocol for application to PCIe 4.0 DUTs, e.g., SSD drives. However, there are no commercially available PCIe 4.0 SSD drives on the market or otherwise available to test. In other words, in order to develop a PCIe 4.0 tester, it needs to be applied to a DUT. But since there are no PCIe 4.0 SSD DUTs, this is a problem for the tester development.

In order to address this issue, in on embodiment, the small scale test board such as the one shown in FIG. 10 can be reprogrammed to allow further functionality, e.g., a small form factor, inexpensive DUT emulator (in addition to also being a miniature test development platform as discussed above). The small scale test board is fully programmable and can be re-programmed to be an end-point to simulate a next generation device (or DUT), for instance. The FPGA, in this embodiment, would comprise an IP core within the protocol engine module 430 that could implement a protocol specific to a next generation DUT (not yet commercially available), e.g., PCIe 4.0 DUTs. This provides an inexpensive way to re-purpose a miniature test card or board as a next generation device. With this small scale DUT emulator, the development of the tester for next generation devices can be readily completed. For example, the IP core inside the FPGA of the small scale test board can be re-programmed to be an end-point to simulate a PCIe 4.0 DUT, for instance.

As discussed previously, FIG. 10 illustrates the small scale test board or test card that can be programmed as a "switch" or miniature test development platform. In accordance with embodiments of the present invention, this test board can also be programmed (repurposed) into a DUT emulator and used in a next generation application. For example, it can be used as an end-point device and emulate a PCIe 4.0 DUT thereby allowing effective development of tester applications for PCIe 4.0 devices. The card 1000 shown in FIG. 10 can be configured to run as a PCIe 4.0 device simulating an NVMe (Non-Volatile Memory Express) SSD using the on-board DDR memory 1016.

As shown in FIG. 10, the board or card contains two connectors, a PCIe connector on the top 1012 and a PCIe edge connector on the bottom 1010 (for mating with an edge connector of a motherboard). The PCIe connectors are powered using the 12V external power connector 1040. The bottom connector 1010 is for interfacing with a computer (or to an interface board connected to a computer or system controller of a tester) and the top connector 1012 is generally not used when the board is being used as a DUT emulator since it is being used as an end-point at that time. There is also a U.2 PCIe connector 1014 on the board which can interface with a DUT, for instance. It should be noted that while the board shown in FIG. 10 comprises PCIe connectors, the board can also be configured directly with connectors for other types of DUTs, e.g., SATA, SAS, etc. Also, adapters are available that could convert the existing PCIe connectors shown in FIG. 10 to communicate with devices using different protocols, e.g., SATA, SAS, etc.

Importantly, the test board or test card of the present invention contains an FPGA 1035 that is programmed to function as a next generation DUT emulator, e.g., an SSD PCIe 4.0 DUT emulator. Further, note that the embodiment in FIG. 10 only comprises a single FPGA 1035 (unlike site module board 301A in FIG. 3 which comprises two FPGAs 316 and 318). However, the invention is not limited to a board with a single FPGA. In other embodiments, the board or card shown in FIG. 10 can comprise more than one FPGA. The design of the DUT emulator is described further below with respect to FIG. 13.

In one embodiment, the board 1000 can also comprise a programmable device power supply (similar to power supplies 332A and 332B shown in FIG. 3).

Figure 11:
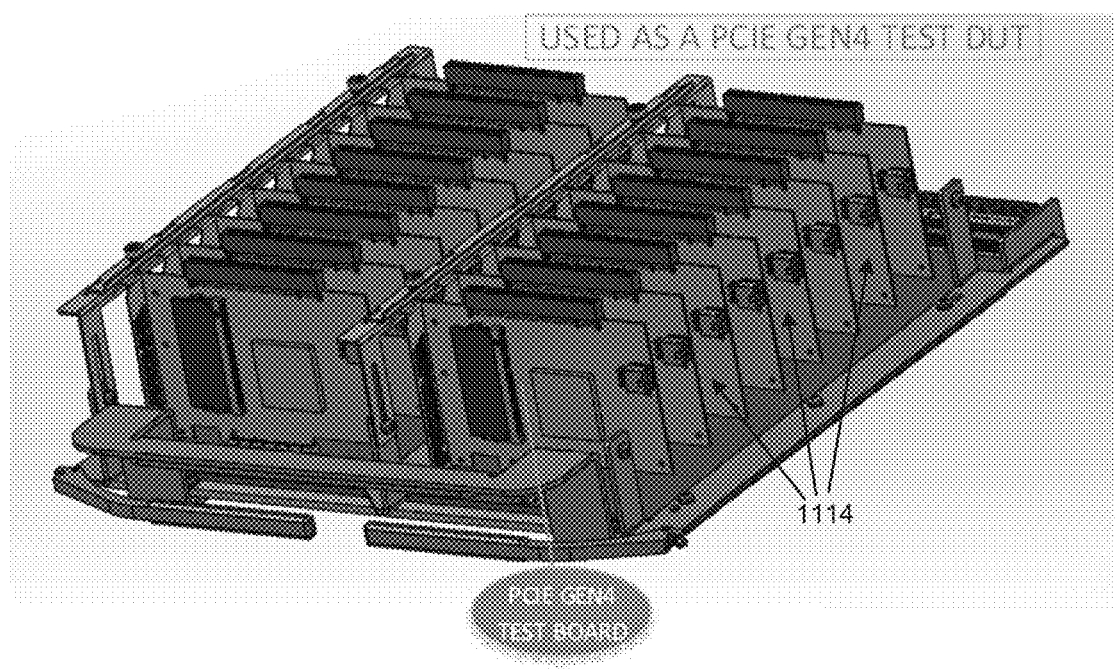
FIG. 11 illustrates an application of 16 DUT emulators connected to an interface board in accordance with an embodiment of the present invention.

FIG. 11 illustrates an application of 16 DUT emulators 1114 connected to an interface board in accordance with an embodiment of the present invention. The interface board can be connected to one or two testers (not shown). In one embodiment, for example, the interface board can be similar to load board 360 on which the DUTs 1114 are loaded and connected to tester slices 340A to 340N, which in turn are connected to and controlled using a system controller 301. In this case, development can be performed on the testers in order to support PCIe generation 4 applications by use of the PCIe 4.0 DUT emulators. In this application, the upper connectors on each DUT emulator 1114 are not used because the boards are acting as end-points.

Figure 12:
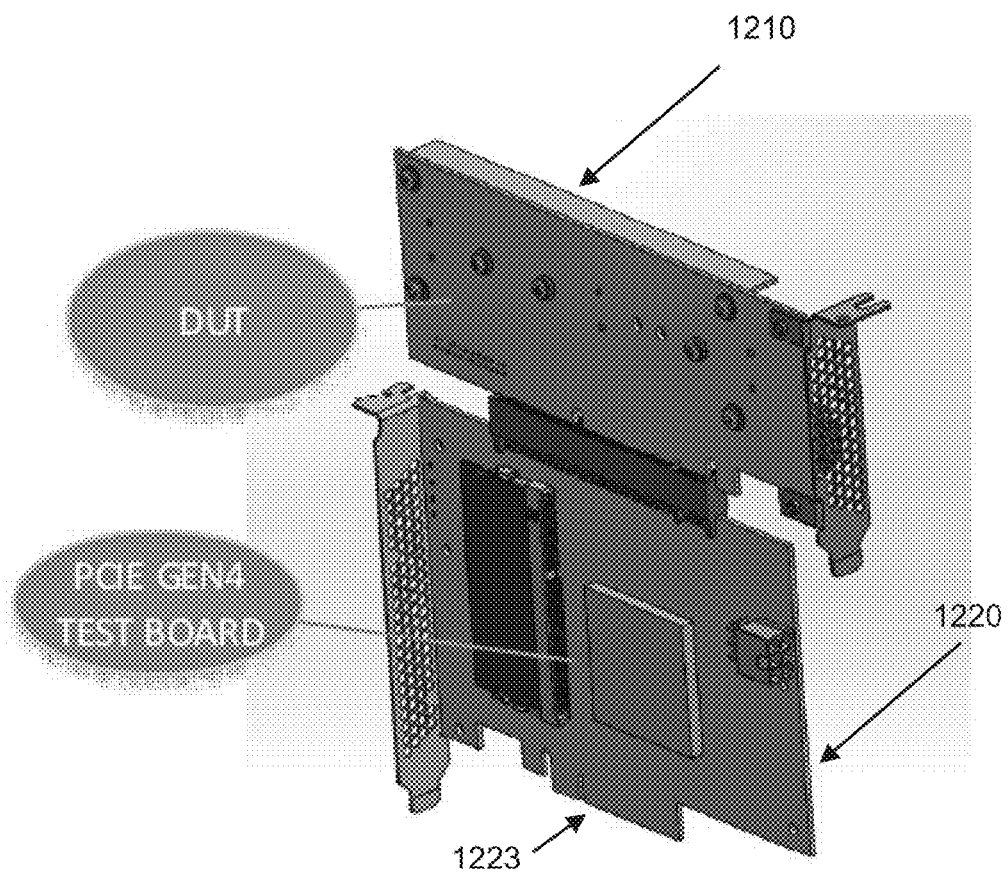
FIG. 12 illustrates the DUT emulator being tested by a miniature test board or test card in accordance with an embodiment of the present invention.

FIG. 12 illustrates the DUT emulator 1210 being tested by a miniature test board or test card 1220 in accordance with an embodiment of the present invention. Each of the two devices share the same hardware design, but one is programmed as a DUT emulator 1210 and the bottom board 1220 is programmed as a test board. In other words, both cards 1210 and 1220 share the same board hardware design, just programmed in different ways to function as different devices. In this fashion, the same test board is versatile and can be programmed to do various functionalities. As shown in FIG. 12, the bottom connector 1223 of the bottom board 1220 would be connected to a motherboard or interface board of a computer or tester (e.g., system controller 301). In the case of an end-point application, the upper connector of the board 1210 is not used. The test development board 1220 and the DUT emulator 1210 can be sold as a single inexpensive units to customers as a low cost platform to be used by engineers for development. Accordingly, the system shown in FIG. 12 can be used by the engineers to develop test applications and debug DUTs at a low cost.

Figure 13:
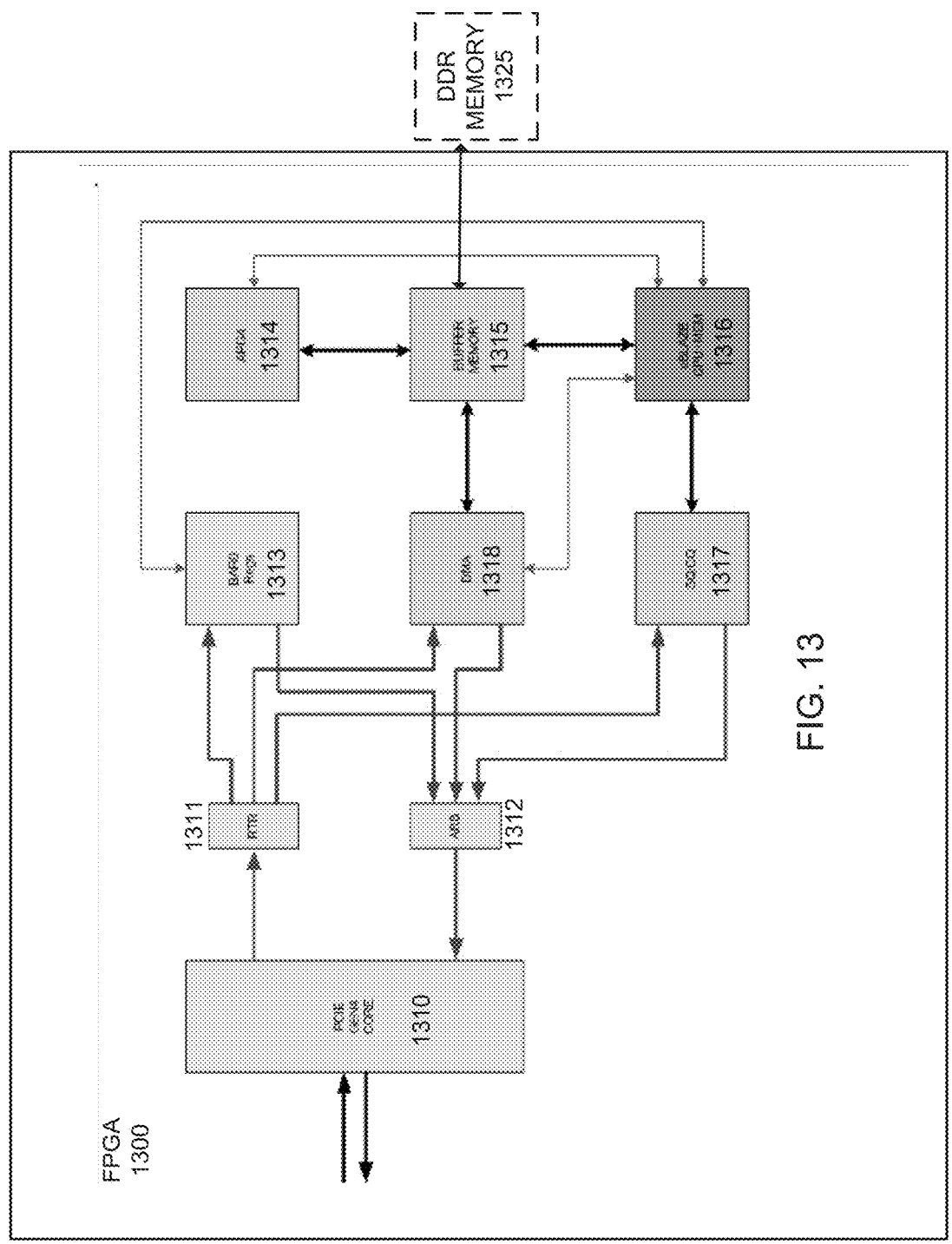
FIG. 13 illustrates the circuit design of the DUT emulator in more detail in accordance with an embodiment of the present invention.

FIG. 13 illustrates the circuit design of the DUT emulator in more detail in accordance with an embodiment of the present invention. FIG. 13 illustrates the components of the FPGA 1300 on the test board when programmed to emulate a DUT. It includes an IP Core 1310 that can easily be reprogrammed and replaced with another IP core for a DUT using a different protocol without changing the physical FPGA chip or other hardware components. For example, although the illustration in FIG. 13 shows the IP Core as being programmed with the PCIE GEN4 (PCIe 4.0) protocol to emulate a SSD PCIe 4.0 DUT, the IP Core could easily be swapped out with a SATA core in order to emulate a SATA-based DUT.

The emulator may be programmed to contain a DMA engine 1318, control registers 1313, submission and completion queue 1317, a buffer memory 1315, and a CPU or controller 1316. Optionally, the emulator may also comprise a router 1311 and an arbiter 1312. The DMA engine 1318 enables data, e.g., pattern data to be transferred in and out of the DUT-emulating FPGA 1300. The submission and completion queues 1317 may be circular buffers used by the host software (running on a connected tester board or tester system) and the DUT emulator to transfer data in and out of the FPGA 1300. The data, for example, can be transferred using the DMA engine 1318 from the host to the DUT emulator end-point device to test whether data can be successfully written to the DUT. The data can be transferred into the FPGA 1300 using the circular buffers 1317 so that it occupies the buffer memory 1315 during transfer. Subsequently, the data can be written to the memory internal to the processor 1316.

The processor 1316 can be programmed to control the transfer of data in and out of the buffer memory 1315 using the DMA engine 1318 and the submission and completion queues 1318. The processor can also be programmed to control the pattern generator 1314.

Importantly, the DUT emulator may utilize an algorithmic pattern generator circuit 1314 for generating known patterns on-the-fly using known algorithms in order to simulate the DUT protocol being tested, e.g., PCIe 4.0. The data generated by the algorithmic pattern generator 1314 can be filled into buffer memory 1315 before it is transferred out to the host memory using DMA engine 1318. The algorithmic pattern generator circuit 1314 can be used, for example, to simulate the SSD memory rather than needing to place FLASH memory on the test board. In other words, the algorithmic pattern generator circuit can be programmed to generate the same patterns as those of the next generation DUT being simulated. In this case, the use of the algorithmic pattern generator circuit, to simulate FLASH memory storage, is much faster than using actual FLASH memory, thereby allowing full testing of the link speed, which is very important to the customer. The algorithmic pattern generator circuit can be used to generate patterns similar to the way discussed in connection with the hardware accelerator pattern generator mode discussed in connection with FIG. 7, however, in this case the DUT end-point shown in FIG. 13 is generating the patterns that are read out by the host tester system, e.g., the test development board discussed in FIG. 10 or the larger tester system discussed in connection with FIGS. 2 and 3.

One advantage of emulating the DUT using the tester board as shown in FIG. 13 is that the algorithmic pattern generator 1314 can generate data much faster than possible using a regular off-the-shelf DUT. Further, the DUT emulator can receive data at a much faster speed than a typical DUT can receive data. Accordingly, the link between the tester and the DUT emulator can be vigorously tested to determine if it can handle high speed transactions.

Further, it is much easier to inject errors using the algorithmic pattern generator circuit. Also, use of the algorithmic pattern generator algorithms to produce pattern data is less complicated than retrieving the data from a FLASH memory, thereby reducing the overall complexity of the DUT emulation. All of these characteristics contribute to a faster, more efficient DUT emulation. In essence, this design allows the effective emulation of a DUT, e.g., an SSD without the inherent limitations of the DUT.

In the case when a particular pattern may need to be stored and retrieved in memory, that is not generated by algorithmic pattern generator circuit, it is possible to use the DDR memory 1325 on the test board for that functionality. In other words, if the pattern generator is not able to generate a particular type of pattern, the DDR memory 1325 can be used to provide the data to the buffer memory 1315, which can then be transferred out to the host using DMA engine 1318.

As shown in FIG. 12, since both test boards 1210 and 1220 each contain an FPGA, the same test board can be reprogrammed to both be a test board, e.g., a PCIe test board and a DUT emulator, e.g., a PCIe 4.0 DUT. FIG. 12 illustrates a PCIe Gen4 test board 1220 coupled to a PCIe Gen4 DUT emulator 1210. Each board shown in FIG. 12 is of the same hardware design, but the top board 1210 is programmed to be a DUT emulator (end-point device) and the bottom board 1220 is the switch or small frame tester. As explained above, both boards share the same board hardware design, but may be programmed in different ways to function as different devices. In this fashion, the same test board is versatile and can be programmed to do various functionalities. As shown in FIG. 12, the bottom connector of the bottom board 1223 would be connected to a motherboard or interface board of a computer or tester. In the case of an end-point application, the upper connector of the upper board is not used.

Figure 5:
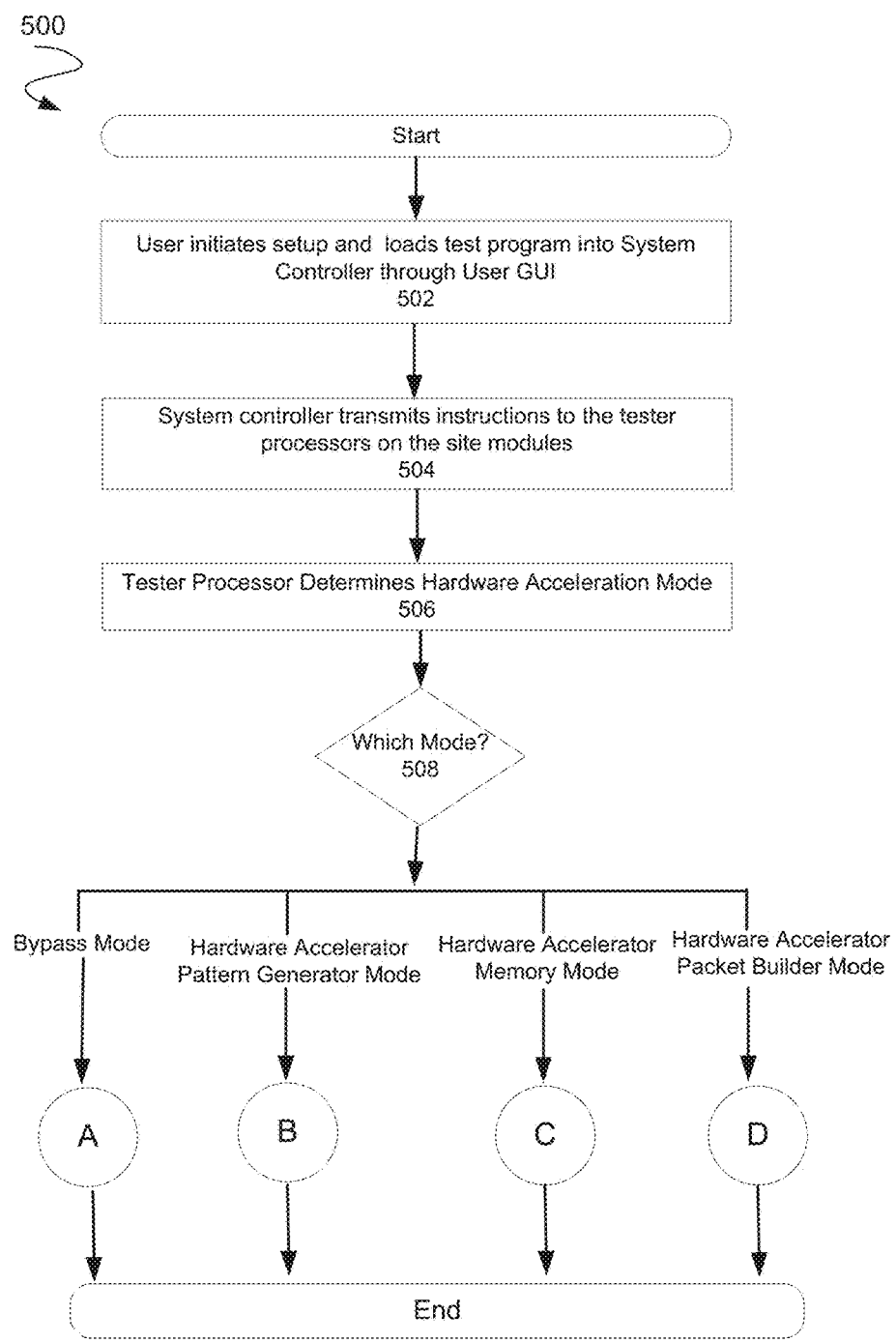
FIG. 5 is a high level flowchart of an exemplary method of testing DUTs according to an embodiment of the present invention.

FIG. 5 depicts a flowchart 500 of an exemplary process of testing DUTs according to an embodiment of the present invention. The invention, however, is not limited to the description provided by flowchart 500. Rather, it will be apparent to persons skilled in the relevant art(s) from the teachings provided herein that other functional flows are within the scope and spirit of the present invention.

Flowchart 500 will be described with continued reference to exemplary embodiments described above in reference to FIGS. 2, 3 and 4, though the method is not limited to those embodiments.

Referring now to FIG. 5, the user initiates setup and loads the test program into system controller at block 502. Initiating setup can comprise choosing one or more protocols from a library of available protocols to be configured onto the FPGA devices in the ATE apparatus 200. The protocols are cached as files on the system controller 301 and can be downloaded as bit files onto the FPGAs. The user can select the protocol from a list of releases available through a graphical user interface. Before a protocol is made available as an option, it has to be built, tested and integrated into a release. FPGA configurations that are released, among other things, contain definitions regarding the protocols supported and the number of transceivers available to connect DUTs. The library of releases can then be made available to a user through a graphical user interface.

At block 502, the user also loads the test program into the system controller 301 through the graphical user interface. The test program defines all the parameters of the test that needs to be run on the DUTs. At block 504, the system controller transmits instructions to the tester processor on the site module 310A. This step includes the transmission of the bit files for the protocol engines to be programmed onto the FPGAs. The system controller can comprise routing logic to route instructions for a particular test program to the tester processor connected to the DUT controlled by the test program.

At block 506, after receiving instructions from the system controller, the tester processor 304 can determine the hardware acceleration mode for running the tests on the DUTs connected to site module 310A.

In one embodiment, the tester processor 304 can operate in one of four different hardware acceleration modes. Each functional mode is configured to allocate functionality for generating commands and test data between the tester processor 304 and the FPGAs 316 and 318. In one embodiment, the tester processor can be programmed to operate in bypass mode, wherein all the commands and test data for testing the DUTs is generated by the tester processor 304 and the FPGAs 316 and 318 are bypassed.

In another embodiment, the tester processor 304 can be programmed to operate in hardware accelerator pattern generator mode, wherein pseudo-random data to be used in the testing of the DUTs is generated by the FPGAs 316 and 318 and the comparing is also done by the FPGAs, but the tester processor handles the command generation.

In yet another embodiment, the tester processor 304 can be programmed to operate in hardware accelerator memory mode, wherein the test pattern is pre-written onto the memory module connected to each FPGA 316 and 318 by the tester processor during initial set-up. The FPGAs in this mode access the dedicated memory device to retrieve the test data to be written to the DUTs, read the test data from the DUTs and compare the read data with the data written on the memory device. In this mode, each of the FPGAs control the memory device in response to read and write operations from the DUTs. The tester processor, however, is still responsible for the command generation in this mode.

In still another embodiment, the tester processor 304 can be programmed to operate in hardware accelerator packet builder mode, wherein the data and basic read/writ/compare commands are generated by the FPGAs 316 and 318.

At block 508, the tester processor branches out to the mode under which the test will be run.

It should be noted that the FPGA 1035 of FIG. 10 can be programmed with any of the four functional modes discussed above, namely, the bypass mode, the hardware accelerator pattern generator mode, the hardware accelerator memory mode and the hardware accelerator packet builder mode. In one embodiment, the computer or system controller that the tester card 1000 is connected to via connector 1010 will perform the functions of the tester processor 304.

Figure 6:
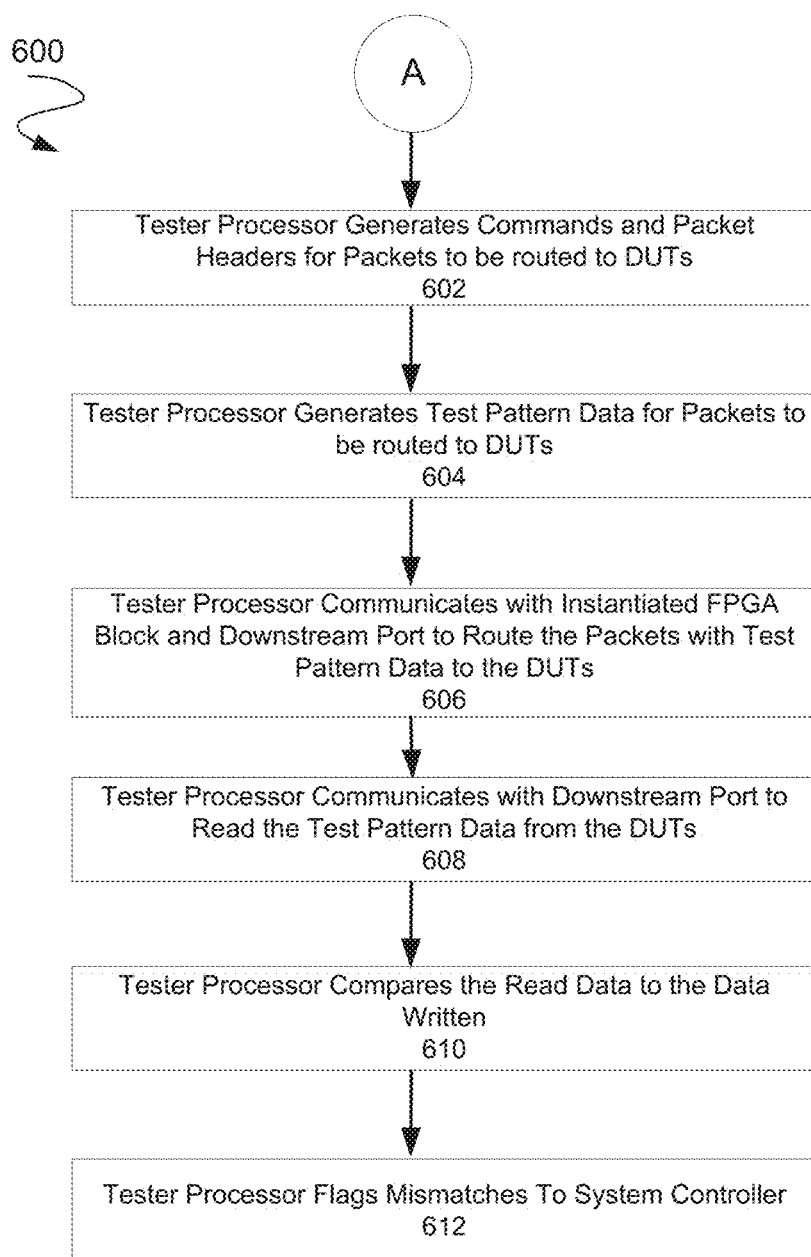
FIG. 6 is a continuation of FIG. 5 and is a flowchart of an exemplary method of testing DUTs in the bypass mode in one embodiment of the present invention.

FIG. 6 depicts a flowchart 600 of an exemplary process of testing DUTs in the bypass mode according to an embodiment of the present invention. The invention, however, is not limited to the description provided by flowchart 600. Rather, it will be apparent to persons skilled in the relevant art(s) from the teachings provided herein that other functional flows are within the scope and spirit of the present invention.

Flowchart 600 will be described with continued reference to exemplary embodiments described above in reference to FIGS. 2, 3 and 4, though the method is not limited to those embodiments.

Referring now to FIG. 6, in bypass mode, at block 602 the tester processor 304 generates commands and packet headers for the test packets to be routed to the DUTs. The tester process at block 604 also generates the test pattern data for the packets to be routed to the DUTs. In this mode there is no hardware acceleration because the tester processor generates its own commands and test data.

At block 606, the tester processor communicates with instantiated FPGA block 410 and downstream port 480 to route the test packets containing the test pattern data to the DUTs. The bypass mode is a pass through mode, wherein, with some limited exceptions, the commands and data pass transparently through the instantiated FPGA block 410 directly to the DUTs. The DUTs are directly controlled by the tester processor 304 in bypass mode. While the instantiated FPGA block can comprise logic to route the packets through to the downstream port, it is not involved in either the command generation (also referred to as "signaling") or the data generation.

At block 608, the tester processor 304 communicates with downstream port 480 to initiate a read operation from the DUTs of the data that was previously written to the DUTs at block 606. At block 610, the tester processor compares the data read from the DUTs to the data written at block 606. If there is any mismatch between the data written at block 606 and the data read at block 610, a flag is sent by the tester processor 304 to the system controller 301 at block 612. The system controller will then flag the mismatch to the user.

In bypass mode, tester processor 304 is constrained in the number of DUTs it can support because its processing capabilities can be maximized quickly from generating all the commands and test data for the DUTs. Also, the number of DUTs that can be supported by site module 310A is further limited by the bandwidth constraints on system buses 330 and 332. In bypass mode, the bandwidth of buses 330 and 332 is exhausted relatively quickly because of the large volume of data that is transmitted by the tester processor 304 over to the DUTs. Thus, other modes with more hardware acceleration are made available, wherein the FPGA devices have more functionality to generate test data and commands.

Figure 7:
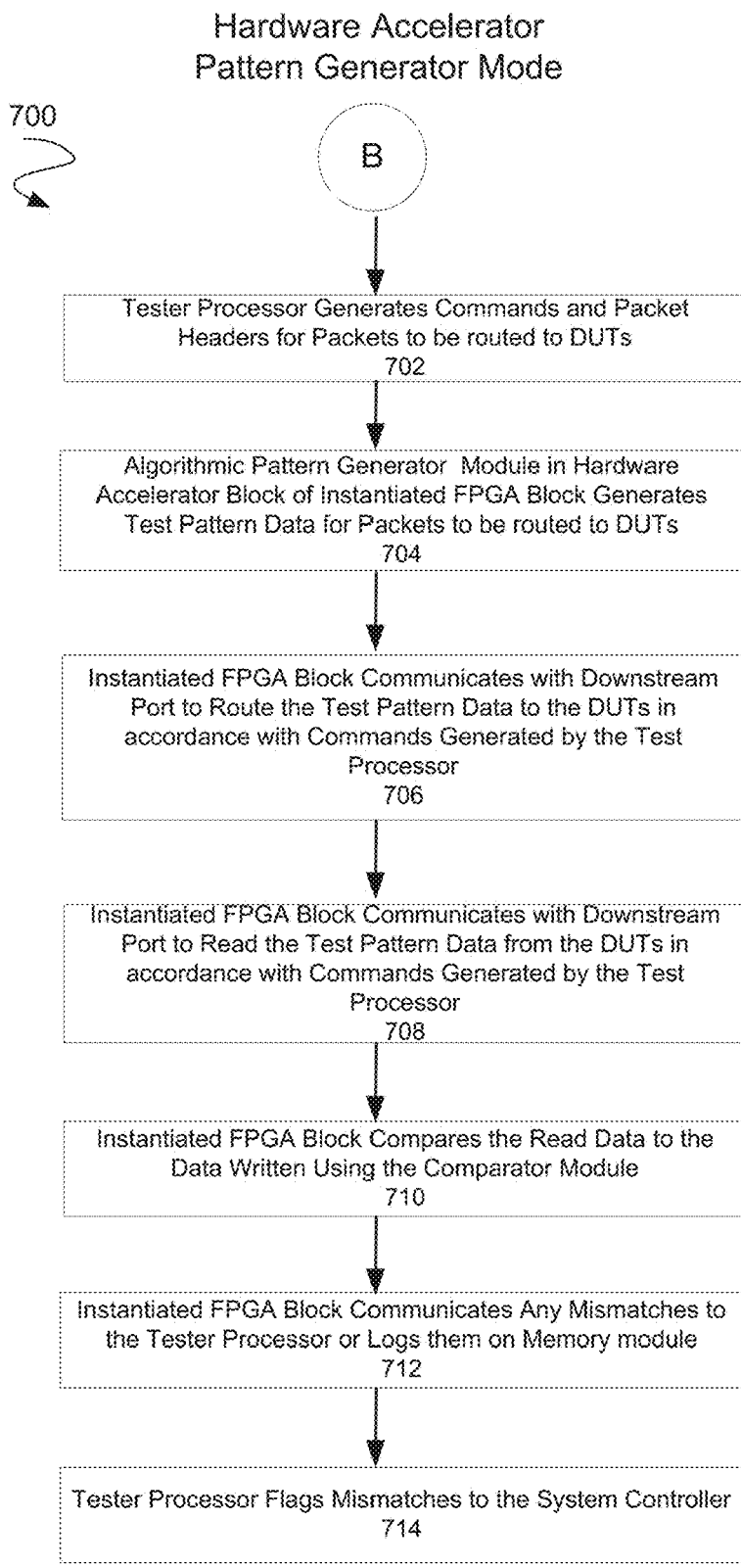
FIG. 7 is a continuation of FIG. 5 and is a flow chart of an exemplary method of testing DUTs in the hardware accelerator pattern generator mode in one embodiment of the present invention.

FIG. 7 depicts a flowchart 700 of an exemplary process of testing DUTs in the hardware accelerator pattern generator mode according to an embodiment of the present invention. The invention, however, is not limited to the description provided by flowchart 700. Rather, it will be apparent to persons skilled in the relevant art(s) from the teachings provided herein that other functional flows are within the scope and spirit of the present invention.

Flowchart 700 will be described with continued reference to exemplary embodiments described above in reference to FIGS. 2, 3 and 4, though the method is not limited to those embodiments.

Referring now to FIG. 7, a method of hardware acceleration is shown wherein the FPGA devices share data generation functionality so as to relieve the processing load on the tester processor 304 and the data load on system buses 330 and 332. At block 702 of the hardware accelerator pattern generator mode, the tester processor 304 generates commands and packet headers for the packets to be routed to the DUTs. The tester process retains the functionality for signaling in this mode. The algorithmic pattern generator module 443 within the hardware accelerator block 440 generates the pseudo random test data to be written to the DUTs at block 704. The logic block module 450 comprises functionality for routing the data generated and adding it to the packets to be written out to the DUTs.

The mode is considered "hardware accelerated" because the functionality for generating data can be done much faster in hardware by the algorithmic pattern generator of the FPGA device than in software by the tester processor. Also the "tester per DUT" architecture allows the DUT to be directly connected to its own dedicated instantiated FPGA tester block generating test pattern data for the DUT as shown in FIG. 4, which results in a substantial increase in bandwidth over the bypass mode where the tester processor 304 supplies all commands and data to the DUTs over system buses 330 and 332. With the FPGA devices sharing in the data generation functionality, the system buses 330 and 332 are freed up so commands can be communicated to the FPGAs at a faster rate than in the bypass mode. Further, for devices, such as solid state drives that require several iterations of testing, having a dedicated data path through the instantiated FPGA tester block speeds up testing considerably over one where the resources of the tester processor are shared by several DUTs. It also allows the DUT to operate at close to full performance because it does not have to wait for the tester processor to allocate processing resources to it.

In one embodiment, the algorithmic pattern generator module 443 can be programmed to generate data on the fly. The APG module can generate incremental patterns, pseudo-random patterns or some type of constant pattern. The APG module can also have certain gating capabilities to generate test patterns with stripes, diagonal stripes or alternating patterns. In one embodiment, the APG module can use finite state machines, counters or linear feedback shift registers, among other things, to generate test patterns. In some implementations, the APG module can be provided a starting seed as an initial value to generate more complex patterns.

At step 706, the instantiated FPGA block 410 communicates with the downstream port 480 to route the test pattern data to the DUTs in accordance with the commands and packet headers generated by the tester processor. The instantiated FPGA block 410, at step 708, communicates with the downstream port to read the test pattern data from the DUTs in accordance with commands generated by the tester processor. The comparator module 446 of the hardware accelerator block 440 is then used to compare the read data to the data written to the DUTs at block 710. The APG module 443 is designed in a way such that the comparator module can perform read operations on it with the same parameters that were used to generate the pseudo-random data and receive the same data that was written to the DUTs at block 704. The APG module 443 regenerates the data that was written to the DUTs on the fly and communicates it to the comparator module 446. Any mismatches are either logged on memory module 420 by the memory control module 444 or communicated by the instantiated FPGA block to the tester processor at block 712. The tester processor subsequently flags mismatches to the system controller at block 714 after receiving the error log.

Figure 8:
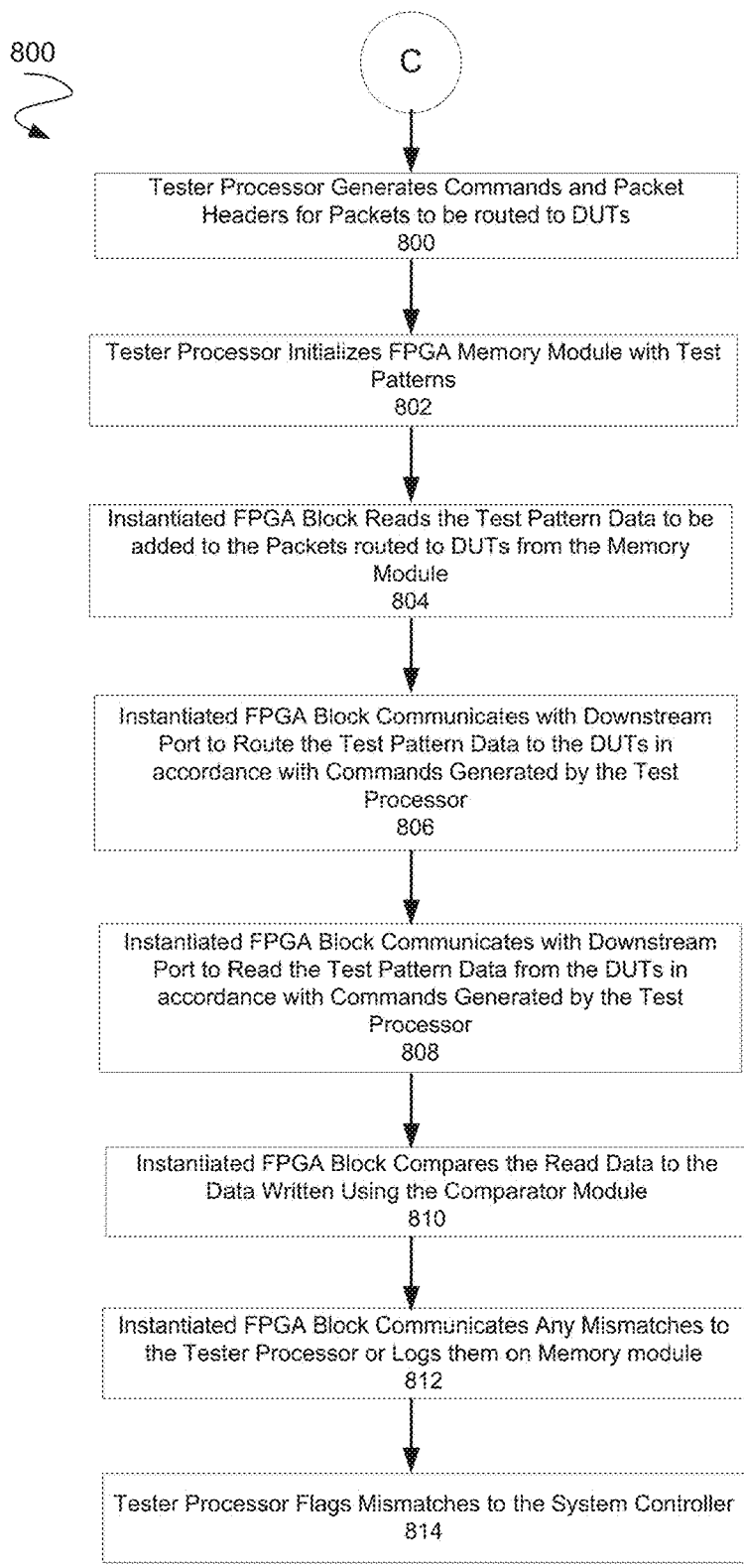
FIG. 8 is a continuation of FIG. 5 and is a flow chart of an exemplary method of testing DUTs in the hardware accelerator memory mode in one embodiment of the present invention.

FIG. 8 depicts a flowchart 800 of an exemplary process of testing DUTs in the hardware accelerator memory mode according to an embodiment of the present invention. The invention, however, is not limited to the description provided by flowchart 800. Rather, it will be apparent to persons skilled in the relevant art(s) from the teachings provided herein that other functional flows are within the scope and spirit of the present invention.

Flowchart 800 will be described with continued reference to exemplary embodiments described above in reference to FIGS. 2, 3 and 4, though the method is not limited to those embodiments.

Referring now to FIG. 8, a method of hardware acceleration is shown wherein the FPGA devices share data generation functionality so as to relieve the processing load on the tester processor 304 and the data load on system buses 330 and 332. As compared to the hardware accelerator pattern generator mode, in the hardware accelerator memory mode, the instantiated FPGA tester block accesses local memory module 420 for the data to be written to the DUTs instead of using the APG module 443.

At block 800 of the hardware accelerator pattern memory mode, the tester processor 304 generates commands and packet headers for the packets to be routed to the DUTs. The tester process retains the functionality for signaling in this mode. At block 802, the tester processor initializes the local memory module 420 of the instantiated FPGA tester block 410 with test patterns to be written out to the DUTs. One advantage of the hardware accelerator memory mode is that the test patterns generated by the tester processor may constitute real random data as opposed to pseudo-random data generated by the APG module 443 in the hardware accelerator pattern generator mode. Both the tester processor and the instantiated FPGA tester block have read and write access to the local memory module 420. However, the tester processor only accesses memory module 420 during initial set-up. During the accelerator mode, the tester processor does not access the memory module because the additional processing load on the tester processor 304 and the additional data load on the system buses 330 and 332 slows the acceleration down considerably.

At block 804, the instantiated FPGA tester block reads the test pattern data to be routed to the DUTs from the memory module 420. Because the memory module 420 is dedicated to the FPGA tester block or shared with just one other FPGA tester block, there is a high bandwidth connection between the two resulting in fast read operations. The logic block module 450 comprises functionality for routing the data generated and adding it to the packets to be written out to the DUTs.

After the data has been added to the packets, at block 806, the instantiated FPGA tester block communicates with the downstream port 480 to route the test pattern data to the DUTs in accordance with the commands and packet headers generated by the tester processor. The instantiated FPGA block 410, at step 808, communicates with the downstream port to read the test pattern data from the DUTs in accordance with commands generated by the tester processor. The comparator module 446 of the hardware accelerator block 440 is then used to compare the read data to the data written to the DUTs at block 810. Any mismatches are either logged on memory module 420 or communicated by the instantiated FPGA block to the tester processor at block 812. The tester processor subsequently flags mismatches to the system controller at block 814 after receiving the error log.

Figure 9:
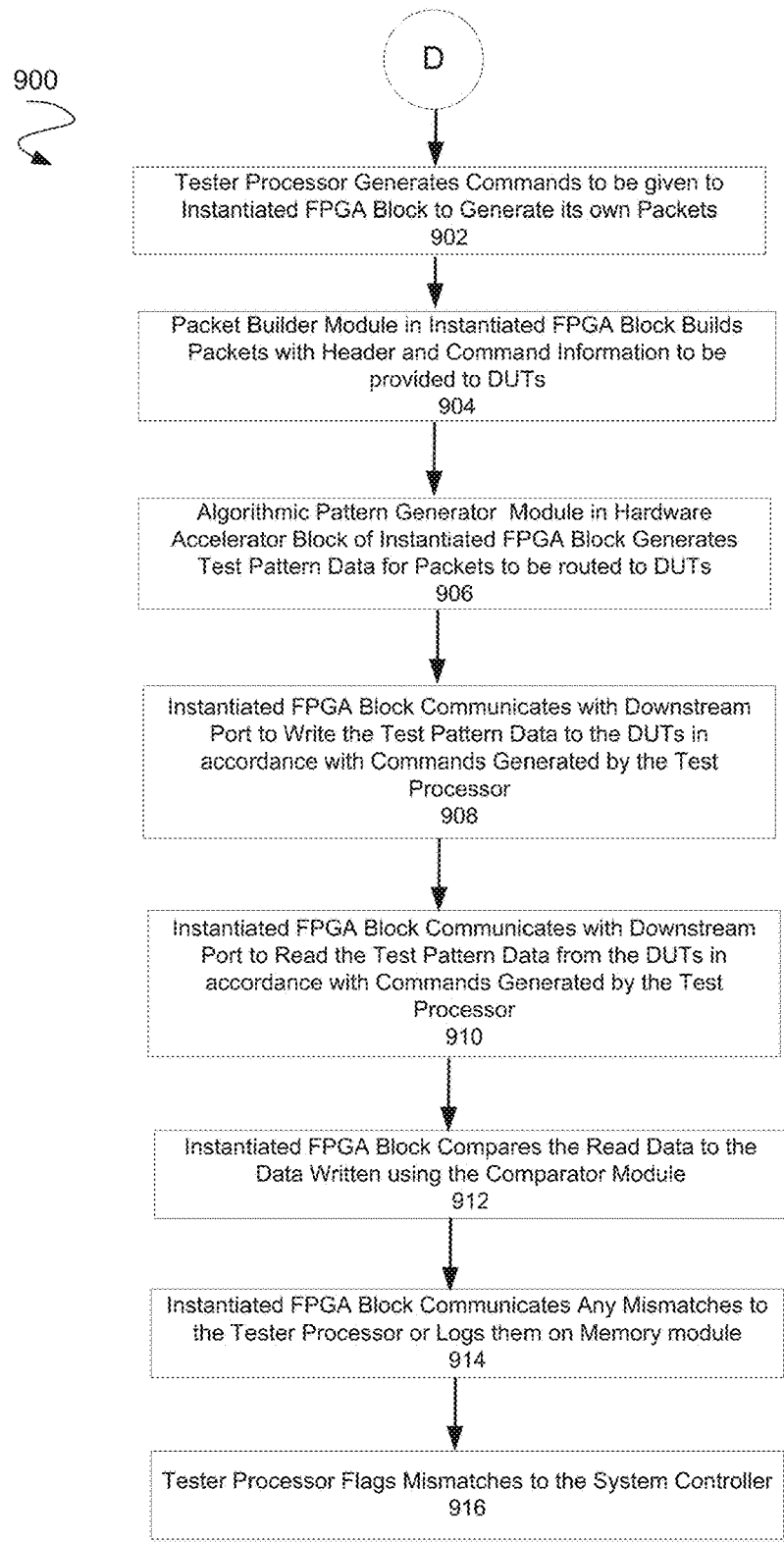
FIG. 9 is a continuation of FIG. 5 and is a flow chart of an exemplary method of testing DUTs in the hardware accelerator packet builder mode in one embodiment of the present invention.

FIG. 9 depicts a flowchart 900 of an exemplary process of testing DUTs in the hardware accelerator packet builder mode according to an embodiment of the present invention. The invention, however, is not limited to the description provided by flowchart 900. Rather, it will be apparent to persons skilled in the relevant art(s) from the teachings provided herein that other functional flows are within the scope and spirit of the present invention.

Flowchart 900 will be described with continued reference to exemplary embodiments described above in reference to FIGS. 2, 3 and 4, though the method is not limited to those embodiments Referring now to FIG. 9, a method of hardware acceleration is shown wherein the FPGA devices share both data and command generation functionality so as to relieve the processing load on the tester processor 304 and the data load on system buses 330 and 332. This mode is also known as "full acceleration" mode because most of the control for running the device tests is shifted to the FPGA devices and the tester processor 304 retains control for only commands other than reads and writes and compares.

At block 902 of the hardware accelerator packet builder mode, the tester processor 304 generates commands to be communicated to the instantiated FPGA block 410 to generate its own packets. The tester processor retains functionality for only the non read/write/compare commands in this mode. The functionality for commands such as read, write and compare operations are conveyed to the instantiated FPGA blocks. At block 904, the packet builder module 445 of the instantiated FPGA tester block builds packets with header and command information to be communicated to the DUTs. The packets comprise at least the command type, the block address of the device and the test pattern data.

The algorithmic pattern generator module 443 within the hardware accelerator block 440 generates the pseudo random test data to be written to the DUTs at block 906. The logic block module 450 comprises functionality for routing the data and commands generated by the instantiated FPGA block and consolidating them into packets to be written out to the DUTs.

At block 908, the instantiated FPGA tester block communicates with the downstream port 480 to route the test pattern data to the DUTs. The instantiated FPGA block 410, at step 910, communicates with the downstream port to read the test pattern data from the DUTs. The comparator module 446 of the hardware accelerator block 440 is then used to compare the read data to the data written to the DUTs at block 912. Any mismatches are either logged on memory module 420 or communicated by the instantiated FPGA block to the tester processor at block 914. The tester processor subsequently flags mismatches to the system controller at block 916 after receiving the error log.

FIG. 14 depicts a flowchart 1400 of an exemplary process of performing a test using a DUT emulator in accordance with an embodiment of the present invention.

At step 1410 a tester board comprising an FPGA is communicatively coupled to an interface board connected to a system controller. The system controller can be similar to the system controller 301 in FIG. 3. The FPGA 1035 on the tester board 1000 is configured to perform the same hardware acceleration functionalities as the FPGAs discussed in connection with FIGS. 2 to 4. Ostensibly, the tester board 1000 does not have a tester processor similar to tester processor 204 or 304 in FIGS. 2 and 3. The tester processor functionality in this case could be programmed into the computer that the FPGA is connected to through the interface board.

At step 1412, the tester board is communicatively coupled to a DUT emulator. The DUT emulator can be programmed onto the same tester board as the one illustrated in FIG. 10. In this instance, the FPGA 1035 on the board comprises an IP core that is programmed to emulate a DUT, e.g., a PCIe 4.0 DUT. The DUT emulator board comprises an algorithmic pattern generator that generates patterns for testing. Further, the DUT emulator is configured to communicate with the tester board in order to test the link between the tester board and the DUT emulator.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. An automated test equipment (ATE) apparatus comprising:
a computer system comprising a system controller, wherein said system controller is communicatively coupled to a site module board comprising a tester processor and an FPGA wherein said system controller is operable to transmit instructions to said tester processor, and wherein said tester processor is operable to generate commands and data from said instructions for coordinating testing of a device under test (DUT) wherein said site module board comprises a compact form factor suitable for use during prototyping, and wherein said site module board is operable to be coupled with said DUT;
the FPGA is communicatively coupled to said tester processor, wherein said FPGA comprises at least one hardware accelerator circuit operable to internally generate commands and data transparently from said tester processor for testing said DUT; and
wherein said tester processor is configured to operate in one of a plurality of functional modes, wherein each functional mode is configured to allocate functionality for generating commands and for generating data between said tester processor and said FPGA in a different manner.

2. The apparatus of claim 1 further comprising a memory device coupled to said FPGA and where said memory device stores test pattern data to be written to said DUT.

3. The apparatus of claim 1, wherein dimensions of said site module board are configured to allow said site module board to be used during testing on a desktop of a user.

4. The apparatus of claim 3, wherein said site module board comprises two connectors, wherein a first connector is operable to interface with said system controller and wherein a second connector is operable to interface with a single connected DUT.

5. The apparatus of claim 4, wherein said two connectors are PCIe connectors.

6. The apparatus of claim 1, wherein a test sequence programmed by said system controller on said tester processor and said FPGA is portable to a larger tester comprising multiple tester processors and FPGA components and capable of testing a plurality of DUTs.

7. The apparatus of claim 1 wherein said functional modes comprise four functional modes comprising a bypass mode, said hardware accelerator pattern generator mode, a hardware accelerator memory mode and a hardware accelerator packet builder mode.

8. The apparatus of claim 7 wherein, in the bypass mode, the tester processor is configured to generate all commands and data for coordinating testing of said DUT.

9. The apparatus of claim 7 wherein, in the hardware accelerator pattern generator mode: said tester processor is configured to generate all commands for coordinating testing of said DUT; and said hardware accelerator circuit of said FPGA perform a step selected from the group comprising: generate test pattern data, write said test pattern data to said DUT and compare the data read from said DUT.

10. The apparatus of claim 7 wherein, in the hardware accelerator memory mode: said tester processor is configured to generate all commands for coordinating testing of said DUT; and said hardware accelerator circuit of said FPGA performs a step selected from the group comprising: read said test pattern data from said memory device, write said test pattern data to said DUT and compare the data read from said DUT.

11. The apparatus of claim 7 wherein, in the hardware accelerator packet builder mode, the hardware accelerator circuit of said FPGA is configured to generate both test data and command data for coordinating testing of said DUT.

12. The apparatus of claim 1, wherein said FPGA comprises an IP core, wherein said IP core is operable to be programmed to emulate a protocol, wherein said protocol is selected from a group consisting of: PCIe, SATA, SAS, or USB.

13. The apparatus of claim 12, wherein said IP core is operable to be re-programmed to emulate a different protocol.

14. A method for testing using an automated test equipment (ATE) comprising:
transmitting instructions from a system controller of a computer system to a tester processor, wherein said system controller is communicatively coupled to a site module board comprising the tester processor and an FPGA, wherein said tester processor is operable to generate commands and data from said instructions for coordinating testing of one or two DUTs;
generating commands and data transparently from said tester processor for testing of a plurality of DUTs using a hardware accelerator circuit programmed within an FPGA, wherein said FPGA is communicatively coupled to said tester processor via a bus on said site module board and wherein said hardware accelerator circuit is operable to test said one or two DUTs; and
operating the tester processor in one of a plurality of functional modes, wherein each functional mode is configured to allocate functionality for generating commands and for generating data between said tester processor and said FPGA in a different manner.

15. The method of claim 14 further comprising storing test pattern data to be written to said one or two DUTs to a memory device, wherein said memory device is coupled to said FPGA.

16. The method of claim 14 wherein said functional modes comprise four functional modes comprising a bypass mode, the hardware accelerator pattern generator mode, a hardware accelerator memory mode and a hardware accelerator packet builder mode.

17. The method of claim 16 wherein the bypass mode further comprises generating all commands and data for coordinating testing of said one or two DUTs using said tester processor.

18. The method of claim 16 wherein the hardware accelerator pattern generator mode comprises: generating all commands for coordinating testing of said one or two DUTs using said tester processor; and using said hardware accelerator circuit to perform a step selected from the group comprising: generating all test pattern data, writing said test pattern data and comparing the test pattern data read from said one or two DUTs.

19. The method of claim 16, wherein, the hardware accelerator memory mode comprises: generating all commands for coordinating testing of said one or two DUTs using said tester processor; and using said hardware accelerator circuit to perform a step selected from the group comprising: reading test pattern data from said memory device, writing said test pattern data to said one or two DUTs, and comparing the data read from said one or two DUTs.

20. The method of claim 16, wherein the hardware accelerator packet builder mode comprises generating all commands and data for coordinating testing of said one or two DUTs using said hardware accelerator circuit.

21. The method of claim 14, wherein dimensions of said site module board are configured to allow said site module board to be used during testing on a desktop of a user.

22. The method of claim 21, wherein a test sequence programmed by said system controller on said tester processor and said FPGA is portable to a larger tester comprising multiple tester processors and FPGA components and capable of testing a plurality of DUTs.

23. The apparatus of claim 21, wherein said site module board comprises two connectors, wherein a first connector is operable to interface with said system controller and wherein a second connector is operable to interface with a single connected DUT.

24. A tester comprising:
a system controller for controlling a test program for testing one or two DUTs;
a site module board operable to interface with and test said one or two DUTs, said site module board coupled to said system controller, wherein said site module board comprises:
a tester processor coupled to communicate with said system controller to receive instructions and data therefrom in accordance with said test program;
a programmable instantiated tester block coupled to said tester processor via a bus on said site module board, wherein said programmable instantiated tester block is operable to generate test data for application to said one or two DUTs in a way transparent to said test processor, further operable to receive and compare test data generated by said one or two DUTs in a way transparent to said tester processor, and further yet operable to be programmed to communicate with said one or two DUTs in a communication protocol compatible with said one or two DUTs; and
a local memory coupled to said programmable instantiated tester block for storing test data therein; and
one or two connectors for coupling said one or two DUTs to said site module board;
wherein each programmable instantiated tester block is operable in one of a plurality of functional modes, wherein each functional mode is configured to allocate functionality for generating commands and for generating data between said tester processor and said programmable instantiated tester block in a different manner.

25. The tester of claim 24, wherein said programmable instantiated tester block is implemented within a Field Programmable Gate Array (FPGA) device.

26. The tester of claim 24, wherein a test sequence programmed by said system controller on said tester processor and said programmable instantiated tester block is portable to a larger tester comprising multiple tester processors and FPGA components and capable of testing a plurality of DUTs.

27. The apparatus of claim 24, wherein said site module board comprises two connectors, wherein a first connector is operable to interface with said system controller and wherein a second connector is operable to interface with a single connected DUT.

* * * * *